(12) United States Patent
Song et al.

(10) Patent No.: US 12,494,146 B2
(45) Date of Patent: Dec. 9, 2025

(54) DRIVING CONNECTOR AND DISPLAY DEVICE INCLUDING THE SAME

(71) Applicant: Samsung Display Co., LTD., Yongin-si (KR)

(72) Inventors: Junyong Song, Hwaseong-si (KR); Keumdong Jung, Seoul (KR); Jiwoong Kim, Suwon-si (KR); Hyunggun Ma, Seoul (KR); Seongjoo Lee, Suwon-si (KR); Sanghyun Heo, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/392,353

(22) Filed: Aug. 3, 2021

(65) Prior Publication Data

US 2022/0122509 A1    Apr. 21, 2022

(30) Foreign Application Priority Data

Oct. 16, 2020  (KR) .......................... 10-2020-0134632

(51) Int. Cl.
*G09G 3/04* (2006.01)
*G09G 3/20* (2006.01)
(Continued)

(52) U.S. Cl.
CPC ........... *G09G 3/20* (2013.01); *H10D 30/6723* (2025.01); *H10D 86/411* (2025.01);
(Continued)

(58) Field of Classification Search
CPC ... G09G 2310/0232; G09G 2310/0243; G09G 2310/0264; G09G 2310/0278;
(Continued)

(56) References Cited

U.S. PATENT DOCUMENTS

2010/0141617 A1\* 6/2010 Chung ................ G02F 1/13452
345/205
2017/0061857 A1  3/2017 Lee et al.
(Continued)

FOREIGN PATENT DOCUMENTS

KR  10-0723492 B1  6/2007
KR  20170026755 A  3/2017
(Continued)

*Primary Examiner* — Dennis P Joseph
(74) *Attorney, Agent, or Firm* — CANTOR COLBURN LLP

(57) ABSTRACT

A display device includes a display panel and a driving connector connected to the display panel and from which driving signals are provided to the display panel, the driving connector including a driving integrated circuit, a gate pad through which a first driving signal is output from the driving connector to the display panel, a first input pad through which the first driving signal is input to the driving connector from outside thereof, and a gate driver which connects the gate pad to the first input pad and includes a first substrate and a transistor on the first substrate and including a source electrode connected to the first input pad and a drain electrode connected to the gate pad. Within the driving connector, the transistor and the driving integrated circuit are in order from the first substrate.

20 Claims, 21 Drawing Sheets

(51) Int. Cl.
*H10D 30/67* (2025.01)
*H10D 86/40* (2025.01)
*H10D 86/60* (2025.01)

(52) U.S. Cl.
CPC .......... *H10D 86/441* (2025.01); *H10D 86/60* (2025.01); *G09G 2300/0426* (2013.01); *G09G 2310/0267* (2013.01); *G09G 2310/0297* (2013.01)

(58) Field of Classification Search
CPC ... G09G 2300/0426; G09G 2310/0267; G09G 2310/0297; H01L 27/1218
See application file for complete search history.

(56) References Cited

U.S. PATENT DOCUMENTS

| | | | |
|---|---|---|---|
| 2018/0217427 A1* | 8/2018 | Lee | H01L 27/124 |
| 2019/0189058 A1 | 6/2019 | Cho et al. | |
| 2020/0135825 A1 | 4/2020 | Cha et al. | |
| 2020/0271979 A1 | 8/2020 | Roh | |
| 2021/0027673 A1* | 1/2021 | Kim | H01L 27/3276 |
| 2022/0114939 A1* | 4/2022 | Kwak | G09G 3/3648 |

FOREIGN PATENT DOCUMENTS

| | | |
|---|---|---|
| KR | 20190072125 A | 6/2019 |
| KR | 20200047898 A | 5/2020 |
| KR | 20200102622 A | 9/2020 |

\* cited by examiner

DRIVING CONNECTOR AND DISPLAY DEVICE INCLUDING THE SAME

This application claims priority to Korean Patent Application No. 10-2020-0134632, filed on Oct. 16, 2020, and all the benefits accruing therefrom under 35 U.S.C. § 119, the contents of which are herein incorporated by reference in their entireties.

BACKGROUND

1. Field

Embodiments relate to a display device. More particularly, embodiments relate to a display device having reduced bezel area.

2. Description of the Related Art

Display devices are used in various electronic devices such as smart phones, tablets, notebook computers and home appliances. The display device may include a display area displaying an image and a non-display area (e.g., a bezel area) which surrounds the display area.

A plurality of pixels may be disposed in the display area. A plurality of drivers may be disposed in the non-display area. The plurality of drivers (e.g., a data driver, a gate driver, etc.) may provide signals to the pixels to display an image in the display area.

Research has been conducted to reduce an area in which the drivers are disposed in order to enlarge the display area.

SUMMARY

Embodiments provide a display device having reduced bezel area.

In an embodiment, a display device includes a display panel including a plurality of pixels, and a driving module in which a first side is on a non-display area of the display panel, and including a driving integrated circuit, a gate pad, a first input pad and a gate driver. The gate driver includes a first substrate and at least one transistor on the first substrate and including a source electrode and a drain electrode. The source electrode is connected to the first input pad, the drain electrode is connected to the gate pad, and the driving integrated circuit is on the transistor.

In an embodiment, the driving module may further include a first connection electrode and a second connection electrode on the transistor and a second input pad and a data pad on the first connection electrode and the second electrode.

In an embodiment, the first connection electrode may connect the source electrode and the first input pad, and the second connection electrode may connect the drain electrode and the gate pad.

In an embodiment, the driving module may further include a first multiplexer connected to the data pad and a second multiplexer connected to the gate pad.

In an embodiment, the first connection electrode may connect the second input pad and the driving integrated circuit, and the second connection electrode may connect the driving integrated circuit and the data pad.

In an embodiment, the driving module may further include a third connection electrode between the first connection electrode and the second input pad and connecting the first connection electrode and the second input pad and a fourth connection electrode between the data pad and the second connection electrode and connecting the data pad and the second connection electrode.

In an embodiment, the driving module may further include a first connection electrode and a second connection electrode on a same layer as the source electrode and a second input pad and a data pad on the first connection electrode and the second connection electrode.

In an embodiment, the first connection electrode may connect the second input pad and the driving integrated circuit, and the second connection electrode may connect the driving integrated circuit and the data pad.

In an embodiment, the driving module may further include a second substrate between the transistor, and the first input pad and the gate pad.

In an embodiment, each of the first substrate and the second substrate may include polyimide.

In an embodiment, the driving integrated circuit and the gate driver may overlap.

In an embodiment, the driving module may further include a shielding electrode between the driving integrated circuit and the gate driver to overlap the driving integrated circuit.

In an embodiment, the driving module may include a transmissive area at the first side.

In an embodiment, the driving module may include at least one gate insulating layer, at least one interlayer insulating layer and at least one via insulating layer on the first substrate, and the at least one gate insulating layer, the at least one interlayer insulating layer and the at least one via insulating layer may not overlap the transmissive area.

In an embodiment, the display device may further include a circuit film connected to a second side opposite to the first side of the driving module.

In an embodiment, the driving module may include a transmissive area at the second side.

In an embodiment, the driving module may include at least one gate insulating layer, at least one interlayer insulating layer and at least one via insulating layer on the first substrate, and the at least one gate insulating layer, the at least one interlayer insulating layer and the at least one via insulating layer may not overlap the transmissive area.

In an embodiment, the driving module may include two or more driving integrated circuits.

In an embodiment, the gate driver may be connected to the driving integrated circuit.

In an embodiment, the driving module may include a plurality of grooves in the driving module at a second side and a third side which is perpendicular to the first side.

In an embodiment, a display device includes a display panel including a plurality of pixels, and a driving module in which a first side is on a non-display area of the display panel, and including a driving integrated circuit, a gate pad, a first input pad and a gate driver. The gate driver includes a first substrate and at least one transistor on the first substrate and including a source electrode and a drain electrode. The source electrode is connected to the first input pad, the drain electrode is connected to the gate pad, and the driving integrated circuit is on the transistor.

Accordingly, the driving integrated circuit and the gate driver may be simultaneously in the driving module, and the bezel area of the display device may be reduced.

BRIEF DESCRIPTION OF THE DRAWINGS

The above and other features and advantages of the invention will become more apparent by describing in detailed embodiments thereof with reference to the accompanying drawings.

DETAILED DESCRIPTION

Figure 1:
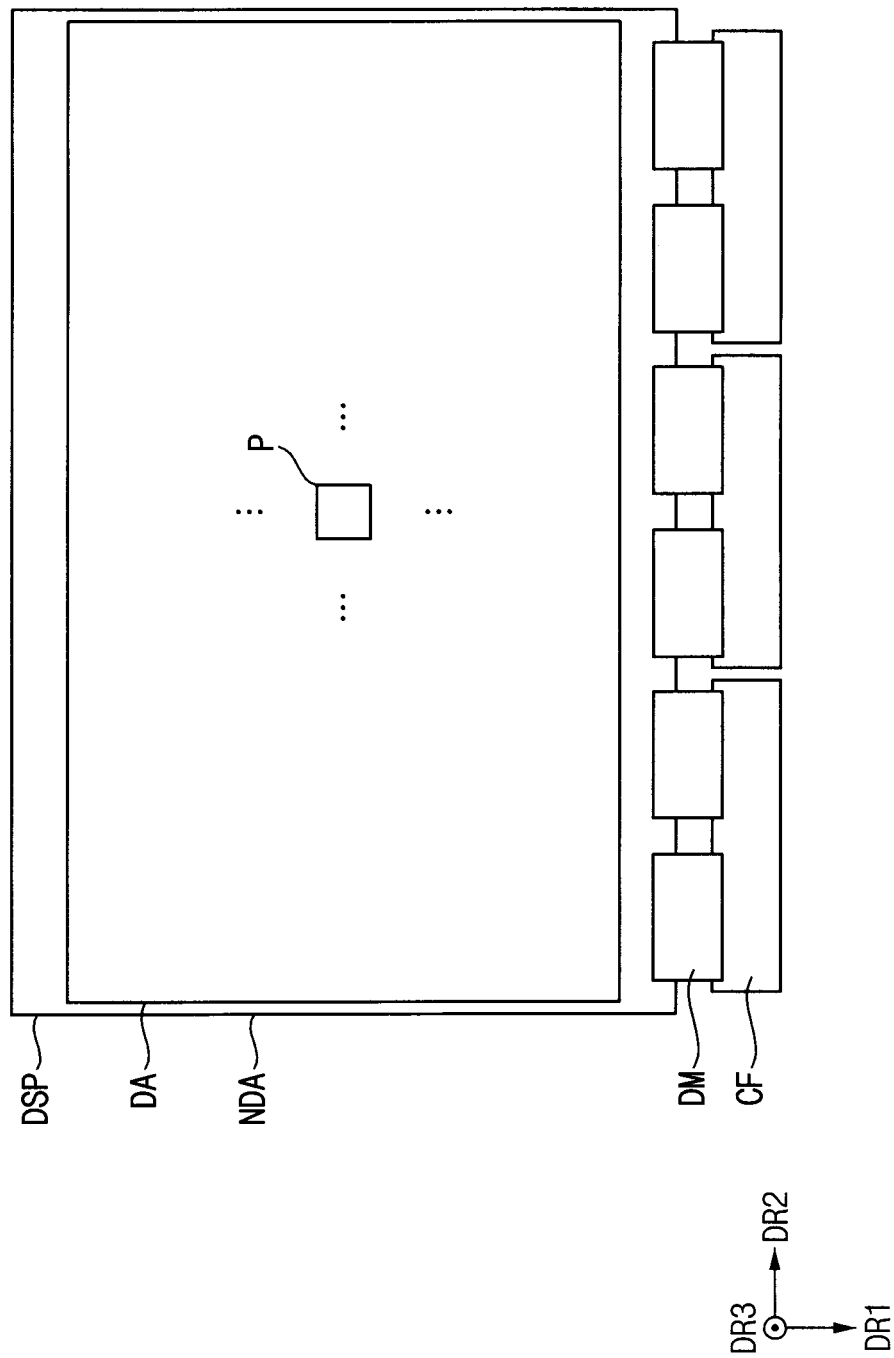
FIG. 1 is a plan view illustrating an embodiment of a display device.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being related to another element such as being "on" another element, it can be directly on the other element or intervening elements may be present therebetween. In contrast, when an element is referred to as being related to another element such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, the invention will be explained in detail with reference to the accompanying drawings.

FIG. 1 is a plan view illustrating an embodiment of a display device.

Referring to FIG. 1, the display device may include a display panel DSP, a driving module DM and a circuit film CF. The driving module DM may be provided in plural including a plurality of driving modules DM such as two driving modules DM.

The display panel DSP may include a display area DA and a non-display area NDA which is adjacent to the display area DA. In an embodiment, the display area DA is provided surrounding the display area DA. A pixel P provided in plural including plurality of pixels P may be disposed in the display area DA. The pixels P may be generally disposed in the display area DA. In an embodiment, for example, the pixels P may be generally arranged in a matrix form in the display area DA. The pixels P may receive electrical signals such as a gate signal (e.g., a first driving signal among driving signals) and a data signal (e.g., a second driving signal among driving signals) from the driving module DM to control the pixel P and display an image. One side of the driving module DM may be disposed on the non-display area NDA. Another side of the driving module DM which is opposite to the one side may be connected to the circuit film CF. The driving module DM may connect the display panel DSP to the circuit film CF. The circuit film CF may be an external device from which an electrical signal is provided to the driving module DM.

In embodiments, the driving module DM may be bendable. In an embodiment, for example, the driving module DM which is bent may dispose the circuit film CF at a rear surface of the display panel DSP.

The circuit film CF may transmit the gate signal and the data signal to the driving module DM. The driving module DM may provide the gate signal and the data signal from the circuit film CF to the pixels P.

In embodiments, a same one of the circuit film CF may be connected to a plurality of driving modules DM including two driving modules DM. However, this is exemplary, and a single one of the circuit film CF may be connected to a single one of the driving module DM, or may be connected to three or more of a plurality of driving modules DM. In addition, in embodiments, for convenience, it is illustrated in FIG. 1 that the plurality of driving modules DM including six driving modules DM are disposed on the display panel DSP, but this is exemplary and is not limited thereto.

Figure 2:
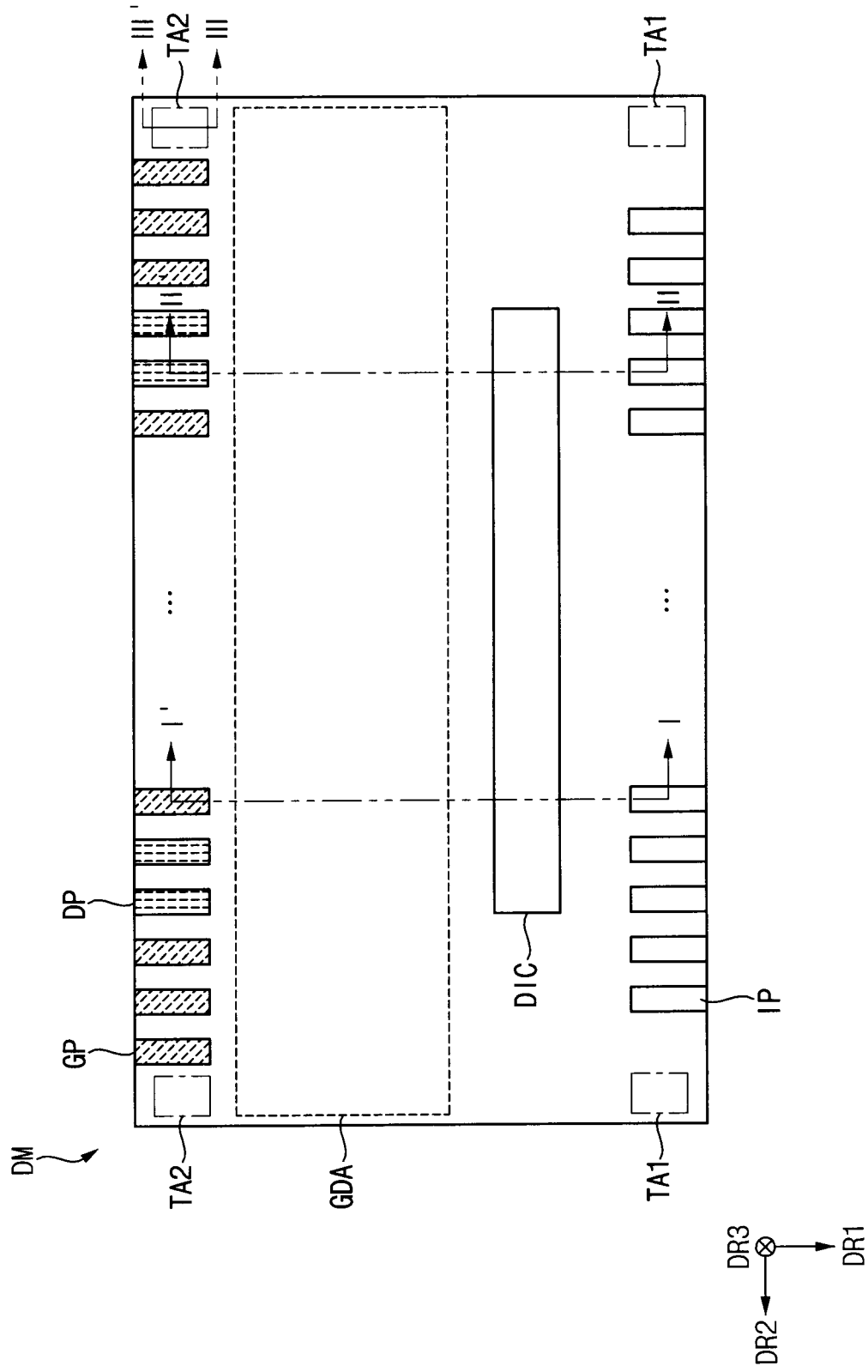
FIG. 2 is a plan view illustrating an embodiment of a driving module included in the display device of FIG. 1.

FIG. 2 is a plan view illustrating an embodiment of a driving module DM included in the display device of FIG. 1. FIG. 2 is a view illustrating an embodiment of a rear surface of the driving module DM illustrated in FIG. 1. FIG. 1 is a view of a front surface of the display panel DSP, the driving module DM and the circuit film CF, and each of these components includes a rear surface which is opposite to the front surface along a thickness direction of the display device.

Referring to FIGS. 1 and 2, a plurality of pads IP, GP and DP and a driving integrated circuit DIC may be disposed within the driving module DM. In embodiments, the plurality of pads may include a gate pad GP (e.g., first pad or first output pad) provided in plural including a plurality of gate pads GP, a data pad DP (e.g., second pad or second output pad) provided in plural including a plurality of data pads DP, and an input pad IP provided in plural including a plurality of input pads IP. The plurality of pads IP, GP and DP may include a conductive material. That is, the driving module DM includes the input pads IP through which an electrical signal is input to the driving module DM from outside thereof, and the gate pads GP and the data pads DP through which an electrical signal is output from the driving module DM to outside thereof (e.g., to the display panel DSP).

In embodiments, some of the input pads IP may receive electrical signals such as gate signals which are supplied to the pixels P and transmit the gate signals to the gate pads GP, such as by bypassing the driving integrated circuit DIC. Another part of the input pads IP may receive electrical signals such as data signals which are supplied to the pixels P and transmit the data signals to the data pads DP through the driving integrated circuit DIC. Alternatively, in embodiments, a gate signal may also be supplied to the gate pads GP after passing through the driving integrated circuit DIC. In an embodiment, the gate driver may be connected to the driving integrated circuit DIC.

The driving module DM may include a gate driving area GDA (e.g., driver area). A driver such as gate driver may be disposed in (e.g., corresponding to) the gate driving area GDA. That is, at least one transistor and at least one capacitor of the gate driver may be disposed in the gate driving area GDA. Through this, an electrical signal such a gate signal for driving the pixels P may be generated in the gate driving area GDA. Electrical signals such as a start signal, a clock signal and the like may be provided to the gate driving area GDA. A gate signal may be provided to the pixels P by using the signals provided to and/or generated in the gate driving area GDA.

The driving module DM may include a plurality of transmissive areas including a first transmissive area TA1 provided in plural including first transmissive areas TA1 and a second transmissive area TA2 provided in plural including second transmissive areas TA2. The first transmissive areas TA1 may be disposed to overlap or correspond to the circuit film CF. An alignment mark may be provided corresponding to a planar area where the circuit film CF overlaps the first transmissive areas TA1 of the driving module DM. The circuit film CF may include the alignment mark. The first transmissive areas TA1 are more transparent (e.g., more light transmissive) than other planar areas of the driving module DM, so that the alignment mark provided in the circuit film CF may be recognized through the driving module DM at the first transmissive areas TA1 thereof. Through this, the circuit film CF and the driving module DM may be precisely combined.

The second transmissive areas TA2 may be disposed to overlap or correspond to the non-display area NDA of the display panel DSP. An alignment mark may also be provided corresponding to a planar area where the non-display area NDA of the display panel DSP overlaps the second transmissive area TA2 of the driving module DM. The second transmissive areas TA2 are more transparent (e.g., more light transmissive) than other planar areas of the driving module DM, so that the alignment mark provided in the non-display area NDA may be recognized through the driving module DM at the second transmissive areas TA2 thereof. Through this, the display panel DSP and the driving module DM may be precisely combined.

Figure 3:
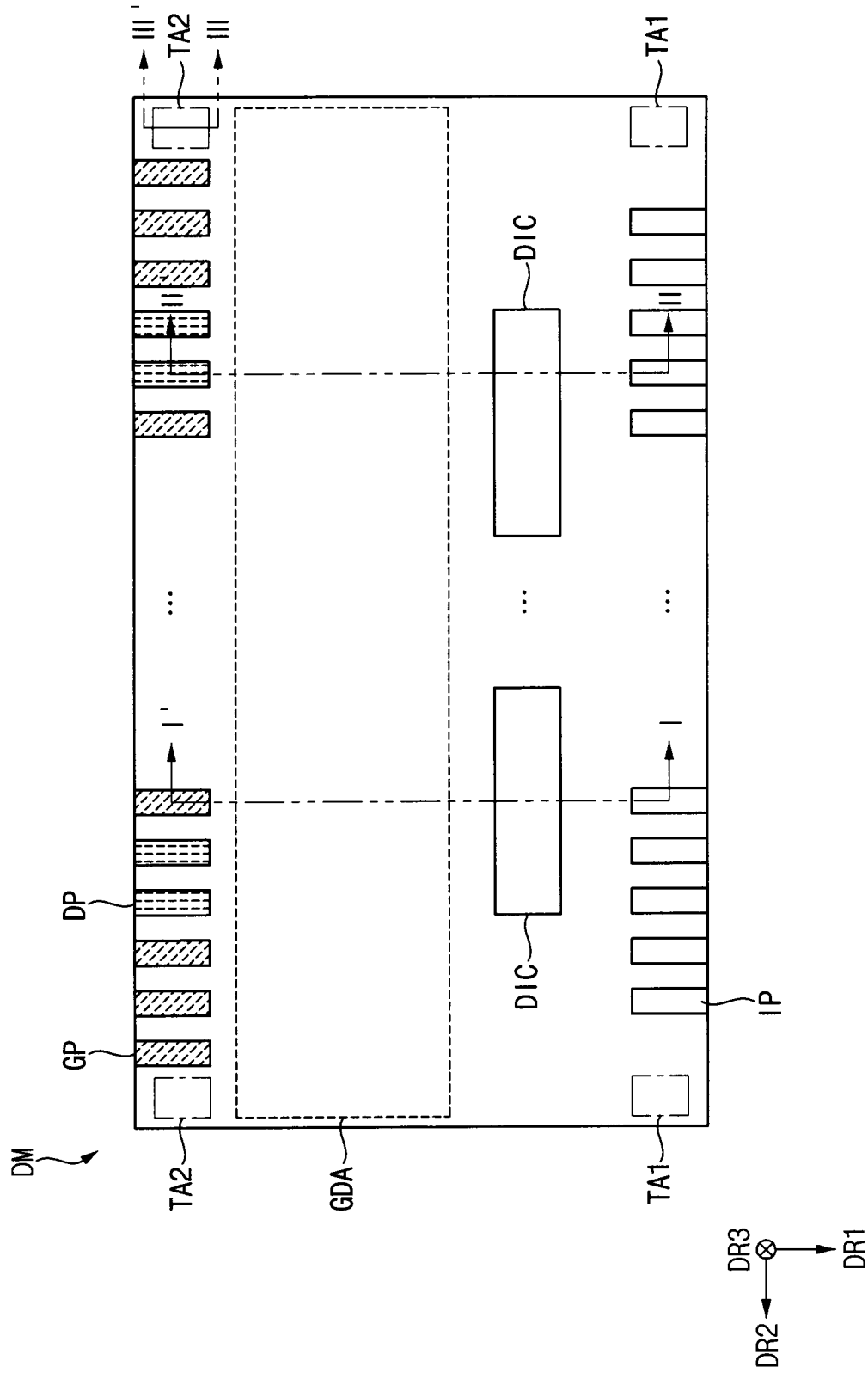
FIG. 3 is a plan view illustrating an embodiment of a driving module included in the display device of FIG. 1.

FIG. 3 is a plan view illustrating an embodiment of a driving module DM included in the display device of FIG. 1. The driving module DM of FIG. 3 may be substantially the same as the driving module DM of FIG. 2 except that there the driving integrated circuit DIC is provided in plural including a plurality of driving integrated circuits DIC such as are two or more driving integrated circuits DIC. Therefore, a description of the overlapping configuration will be omitted.

Figure 4:
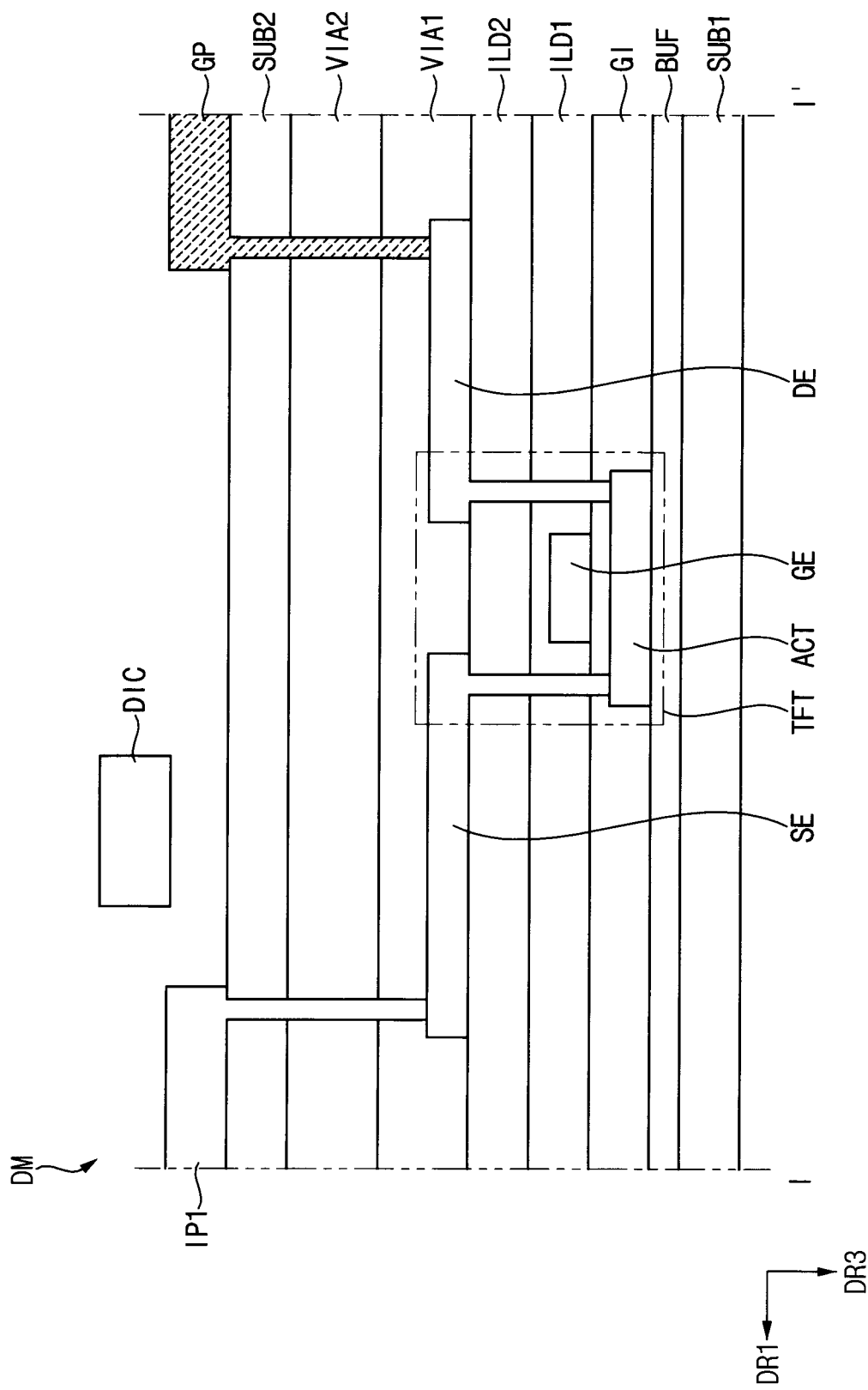
FIG. 4 is a cross-sectional view illustrating an embodiment taken along the line I-I' of FIG. 2.

FIG. 4 is a cross-sectional view illustrating an embodiment taken along the line I-I' of FIG. 2. Referring to FIGS. 2 and 4, the gate driver may include at least one transistor and at least one capacitor. In an embodiment, for example, the gate driver may include a transistor TFT. The transistor TFT may not overlap the driving integrated circuit DIC along the third direction DR3. In an embodiment, the driving integrated circuit DIC may be spaced apart from the transistor TFT of the gate driver along the first direction DR1.

Referring to FIGS. 2 and 4, the driving module DM may include a first substrate SUB1, buffer layer BUF, gate insulating layer GI, a first interlayer insulating layer ILD1, a second interlayer insulating layer ILD2, a first via insulating layer VIA1, a second via insulating layer VIA2, a second substrate SUB2, a first input pad IP1, a gate pad GP, a driving integrated circuit DIC and a transistor TFT. The transistor TFT may include an active layer ACT, a gate electrode GE, a source electrode SE and a drain electrode DE.

The first substrate SUB1 may include a plastic material. Accordingly, the first substrate SUB1 may have a flexible characteristic such that the driving module DM is bendable. In an embodiment, for example, the first substrate SUB1 may include polyimide ("PI"). Alternatively, in embodiments, the first substrate SUB1 may include glass. Accordingly, the first substrate SUB1 may have rigid characteristics. That is, the driving module DM may be a driving connector which connects the display panel DSP to the circuit film CF as the external device from which driving signals are provided. The circuit film CF may be a circuit board, a circuit substrate, etc. from which the driving signals are provided to the driving connector.

The buffer layer BUF may be disposed on the first substrate SUB1. The buffer layer BUF may reduce or effectively prevent diffusion of metal atoms or impurities from the first substrate SUB1 into the active layer ACT. In addition, the buffer layer BUF may control a heat supply rate during a crystallization process during providing or forming of the active layer ACT, and accordingly, the active layer ACT may be uniformly provided or formed.

The active layer ACT may be disposed on the buffer layer BUF. In embodiments, the active layer ACT may include an oxide-based semiconductor material. In an embodiment, for example, the oxide-based semiconductor material may include at least one selected from zinc oxide ("ZnOx"), tin oxide ("SnOx"), indium oxide ("InOx"), indium-zinc oxide ("IZO"), indium-gallium oxide ("IGO"), zinc-tin oxide ("ZnSnxOy") and indium-gallium-zinc oxide ("IGZO").

Alternatively, in embodiments, the active layer ACT may include a silicon-based semiconductor material. In an embodiment, for example, the silicon-based semiconductor material may include at least one selected from amorphous silicon, polycrystalline silicon and the like.

The gate insulating layer GI may be disposed on the buffer layer BUF to cover the active layer ACT. The gate insulating layer GI may include an insulating material. In an embodiment, for example, the gate insulating layer GI may include an inorganic insulating material at least one selected from silicon oxide ("SiOx"), silicon nitride ("SiNx"), and silicon oxynitride ("SiNxOy").

The gate electrode GE may be disposed on the gate insulating layer GI. The gate electrode GE may be disposed to overlap or correspond to the active layer ACT. The gate electrode GE may include a conductive material. In an embodiment, for example, the gate electrode GE may include at least one selected from a metal, an alloy, a conductive metal oxide, a transparent conductive material and the like. In an embodiment, for example, the gate electrode GE may include at least one selected from silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), Scandium ("Sc"), indium tin oxide ("ITO"), indium zinc oxide ("IZO") and the like.

The first interlayer insulating layer ILD1 may be disposed on the gate insulating layer GI while covering the gate electrode GE. The first interlayer insulating layer ILD1 may include an insulating material. In an embodiment, for example, the first interlayer insulating layer ILD1 may include an inorganic insulating material. The first interlayer insulating layer ILD1 may include at least one selected from silicon oxide ("SiOx"), silicon nitride ("SiNx") and silicon oxynitride ("SiNxOy").

The second interlayer insulating layer ILD2 may be disposed on the first interlayer insulating layer ILD1. The second interlayer insulating layer ILD2 may include an insulating material. In an embodiment, for example, the second interlayer insulating layer ILD2 may include an inorganic insulating material. The second interlayer insulating layer ILD2 may include at least one selected from silicon oxide ("SiOx"), silicon nitride ("SiNx") and silicon oxynitride ("SiNxOy").

At least one electrode (not illustrated) may be disposed between the first interlayer insulating layer ILD1 and the second interlayer insulating layer ILD2. In an embodiment, for example, a capacitance electrode may be disposed between the first interlayer insulating layer ILD1 and the second interlayer insulating layer ILD2 along a thickness direction. Accordingly, an electrode (not illustrated) disposed in a same layer as the gate electrode GE may form a capacitor together with the capacitance electrode. As being in a same layer, elements or patterns may be respective portions of a same material layer on the first substrate SUB1 and/or may each extend into a same material layer on the first substrate SUB1, without being limited thereto.

The source electrode SE and the drain electrode DE may be disposed on the second interlayer insulating layer ILD2. The source electrode SE and the drain electrode DE may include at least one selected from a metal, an alloy, a conductive metal oxide, a transparent conductive material and the like. Each of the source electrode SE and the drain electrode DE may be connected to the active layer ACT at or through a contact hole.

The first via insulating layer VIA1 may cover the source electrode SE and the drain electrode DE and may be disposed on the second interlayer insulating layer ILD2. In embodiments, the first via insulating layer VIA1 may include or be formed of an organic insulating material such as polyimide ("PI").

Alternatively, in embodiments, the first via insulating layer VIA1 may include or be formed of an inorganic insulating material such as an inorganic insulating material of the above-described interlayer insulating layers ILD1, ILD2 and ILD3. This may be applied equally to the various via insulating layers described below.

The second via insulating layer VIA2 may be disposed on the first via insulating layer VIA1. In embodiments, the second via insulating layer VIA2 may include or be formed of an organic insulating material such as polyimide ("PI").

The second substrate SUB2 may include a plastic material. Accordingly, the second substrate SUB2 may have a flexible characteristic. In an embodiment, for example, the second substrate SUB2 may include polyimide ("PI"). Alternatively, in embodiments, the second substrate SUB2 may include glass. Accordingly, the second substrate SUB2 may have rigid characteristics.

The first input pad IP1 may be disposed on the second substrate SUB2. The first input pad IP1 may be a pad among the input pads IP of FIG. 2 which is connected to the gate pad GP. The first input pad IP1 may be connected to the transistor TFT. The first input pad IP1 may receive a signal from an external device (e.g., the circuit film CF of FIG. 1). The signal may include an electrical signal (e.g., input signal, driving signal, control signal, etc.) for driving the gate driver in the gate driving area GDA. In an embodiment, for example, a clock signal, a start signal or the like may be transmitted to the gate driver through the first input pad IP1.

The gate driver may transmit a gate signal to the gate pad GP. Through this, the gate signal may be transmitted to the pixels P of FIG. 1.

The driving integrated circuit DIC may be disposed on the second substrate SUB2. The driving integrated circuit DIC may be connected to connection electrodes to be described to later and fixed on the second substrate SUB2. An upper surface of the second substrate SUB2 may be exposed to outside the driving module DM.

Figure 5:
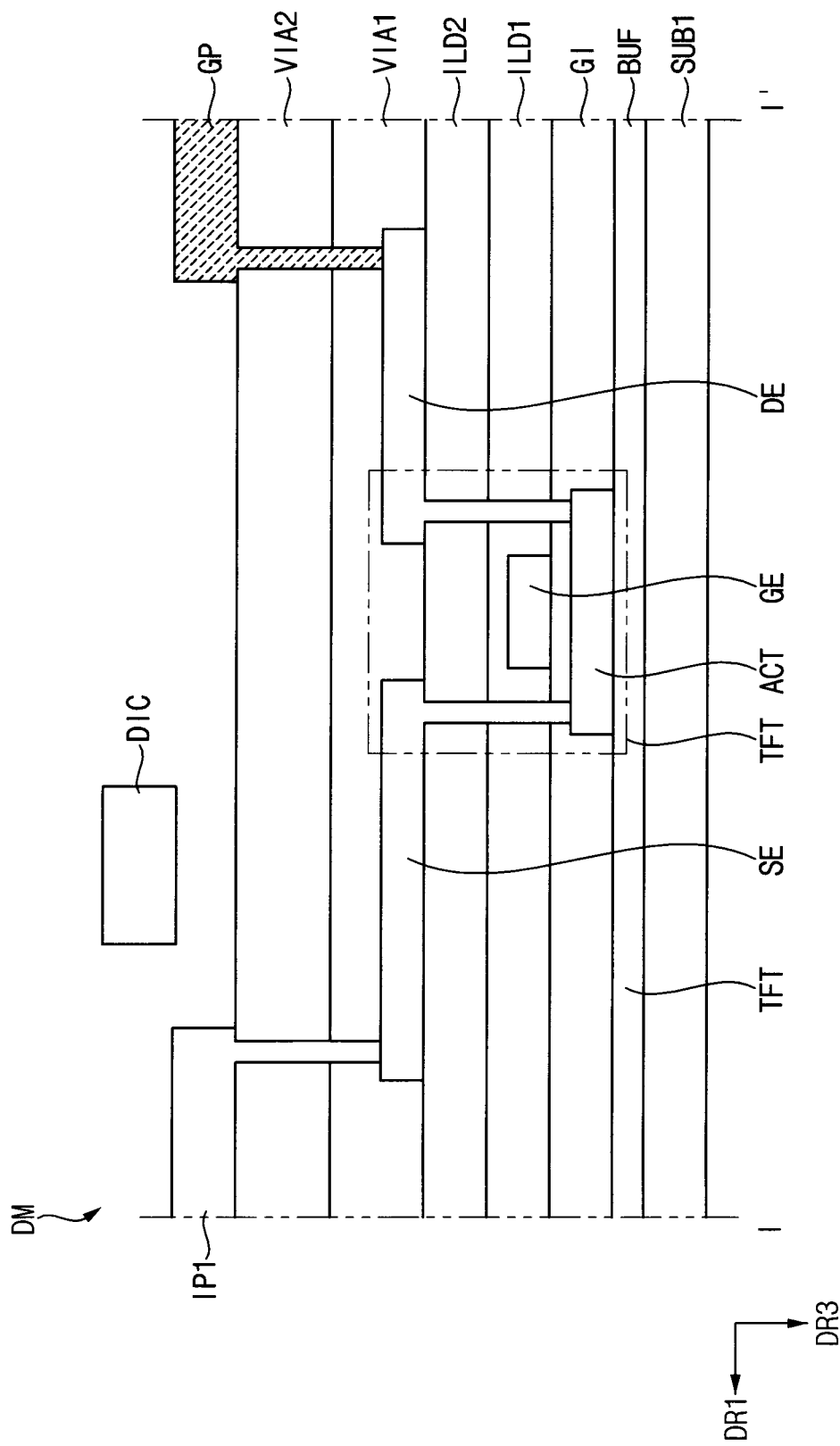
FIG. 5 is a cross-sectional view illustrating an embodiment taken along the line I-I' of FIG. 2.

FIG. 5 is a cross-sectional view illustrating an embodiment taken along the line I-I' of FIG. 2.

Referring to FIG. 5, FIG. 5 may be structurally the same as FIG. 4 except that the second substrate SUB2 is excluded from FIG. 4. However, the second via insulating layer VIA2 may include an inorganic insulating material to protect the lower layers disposed under the second via insulating layer VIA2 from external impact. In an embodiment, for example, the second via insulating layer VIA2 may include at least one selected from silicon oxide ("SiOx"), silicon nitride ("SiNx"), silicon oxynitride ("SiNxOy") and the like. An upper surface of the second via insulating layer VIA2 may be exposed to outside the driving module DM.

Figure 6:
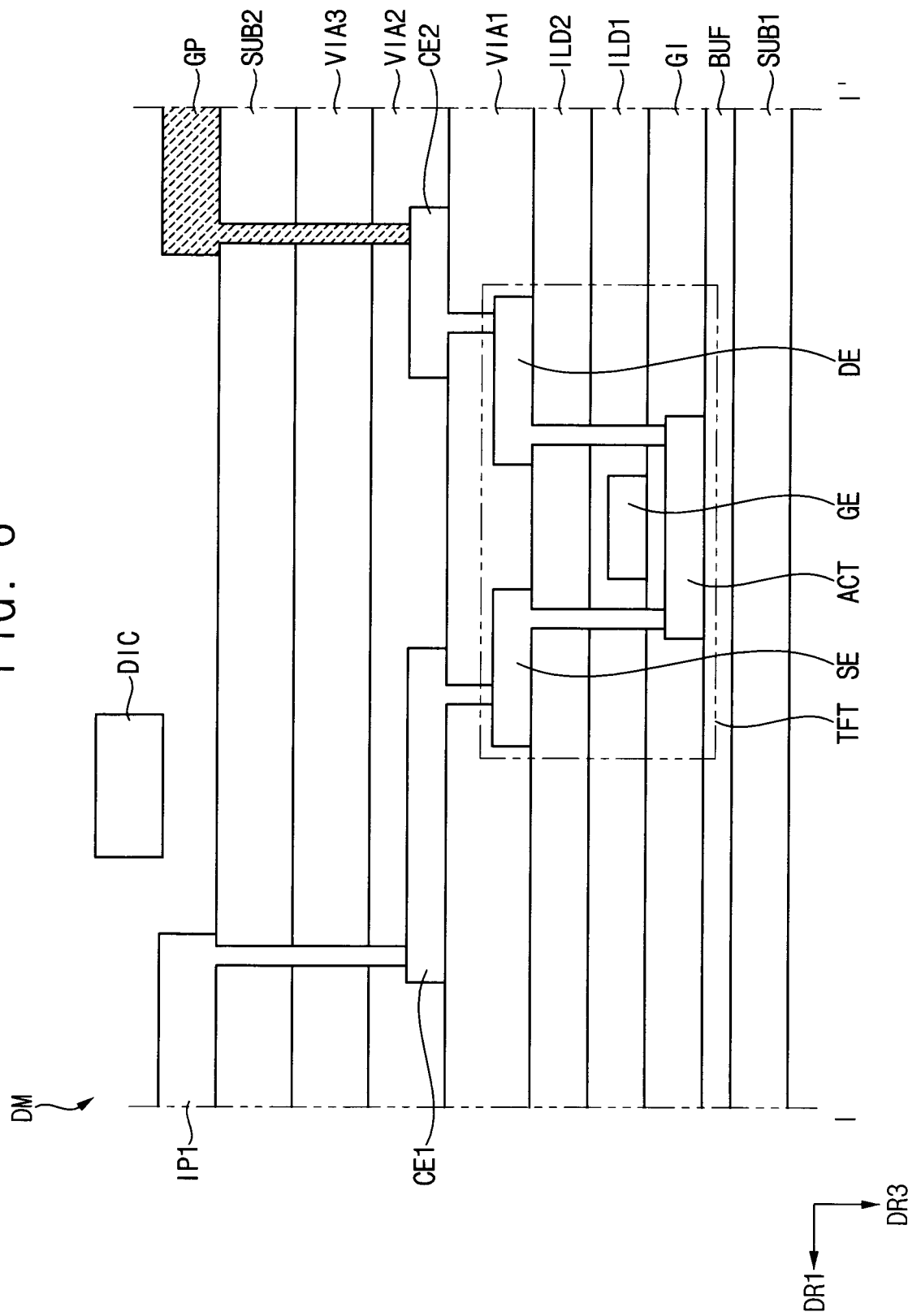
FIG. 6 is a cross-sectional view illustrating an embodiment taken along the line I-I' of FIG. 2.

FIG. 6 is a cross-sectional view illustrating an embodiment taken along the line I-I' of FIG. 2.

Referring to FIG. 6, the driving module DM may further include a third via insulating layer VIA3 disposed on the second via insulating layer VIA2. The second via insulating layer VIA2 and the third via insulating layer VIA3 may include substantially the same material.

A plurality of electrodes may be disposed on the first via insulating layer VIA1. The plurality of electrodes connects the transistor TFT to various pads of the driving module DM. In embodiments, the plurality of first connection electrodes may include a first connection electrode CE1 and a second connection electrode CE2 disposed on the first via insulating layer VIA1. The first connection electrode CE1 may connect the first input pad IP1 and the source electrode SE to each other. The second connection electrode CE2 may connect the gate pad GP and the drain electrode DE to each other. The first connection electrode CE1 and the second connection electrode CE2 are in a same layer as each other.

However, this is exemplary, and the pads IP and GP and the transistor TFT may be variously connected to each other by more connection electrodes than shown in FIG. 6. In an embodiment, for example, separate connection electrodes may be disposed between the second via insulating layer VIA2 and the third via insulating layer VIA3 in addition to the plurality of electrodes may be disposed on the first via insulating layer VIA1.

Figure 7:
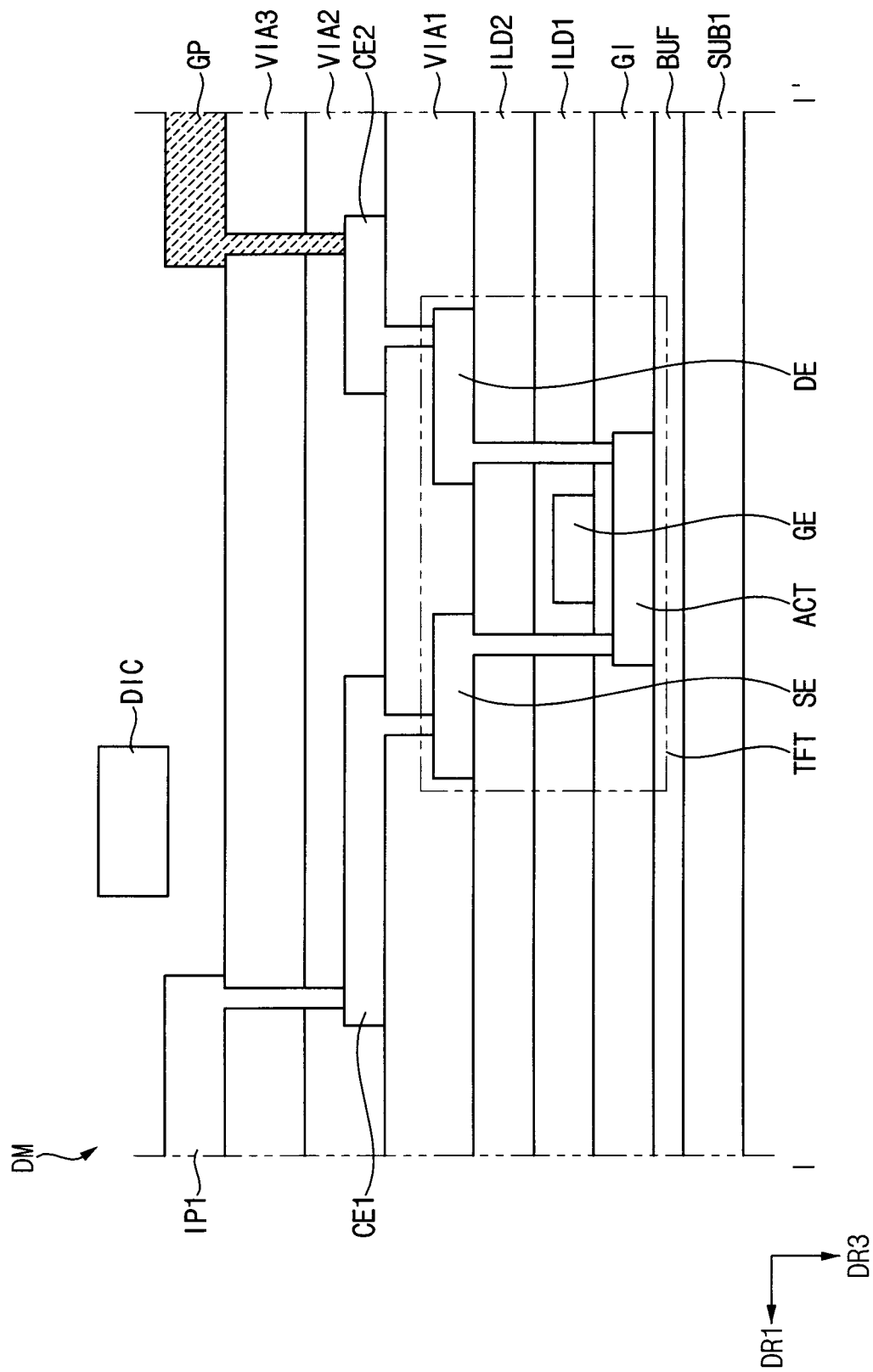
FIG. 7 is a cross-sectional view illustrating an embodiment taken along the line I-I' of FIG. 2.

FIG. 7 is a cross-sectional view illustrating an embodiment taken along the line I-I' of FIG. 2.

Referring to FIG. 7, FIG. 7 may be structurally the same as FIG. 6 except that the second substrate SUB2 is excluded from FIG. 6. However, in order to protect the lower layers from external impact, the third via insulating layer VIA3 may include an inorganic insulating material. In an embodiment, for example, the third via insulating layer VIA3 may include any one selected from silicon oxide ("SiOx"), silicon nitride ("SiNx") and silicon oxynitride ("SiNxOy").

Figure 8:
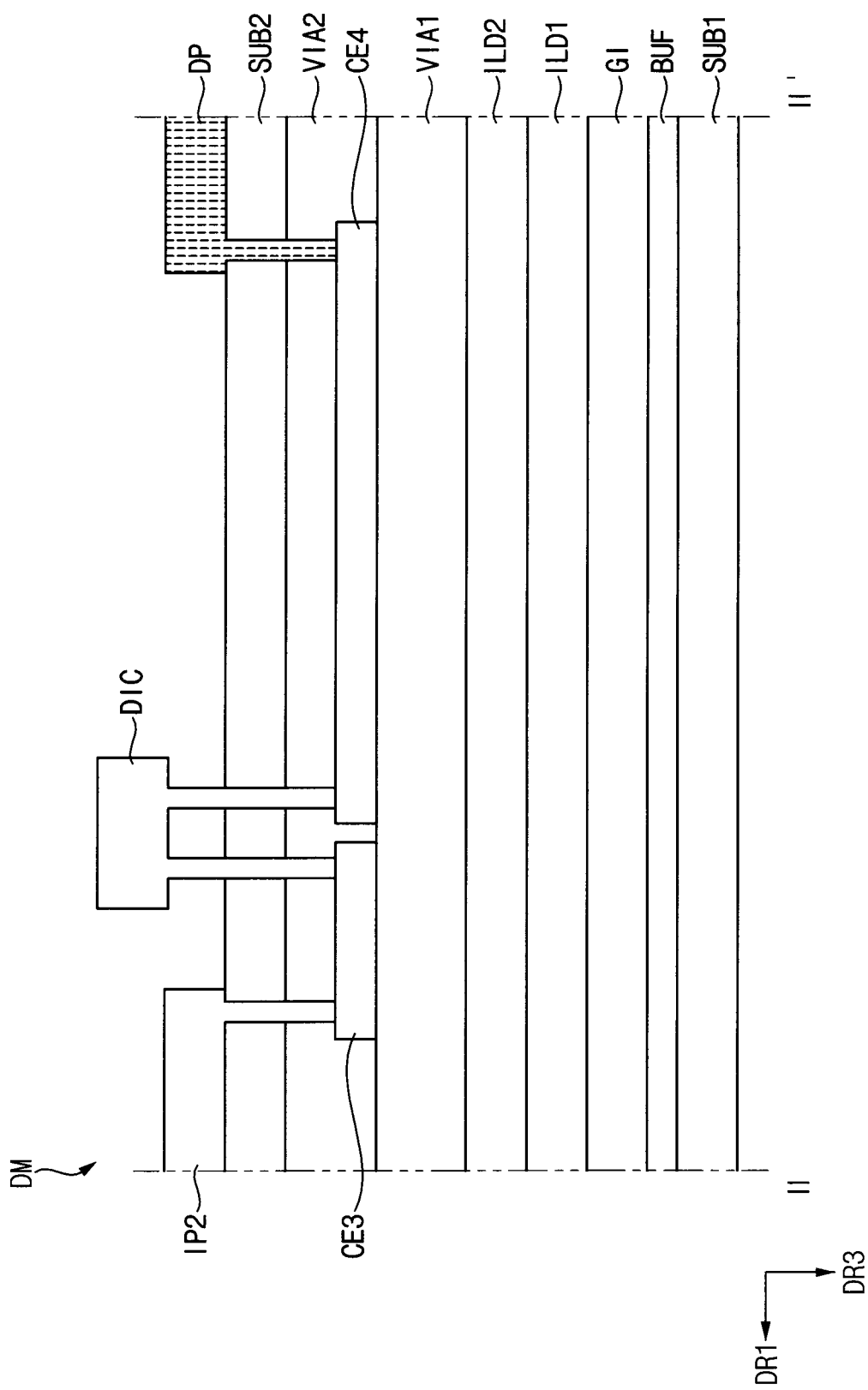
FIG. 8 is a cross-sectional view illustrating an embodiment taken along the line II-II' of FIG. 2.

FIG. 8 is a cross-sectional view illustrating an embodiment taken along the line II-II' of FIG. 2.

Referring to FIGS. 2 and 8, the driving module DM may include a first substrate SUB1, a buffer layer BUF, a gate insulating layer GI, a first interlayer insulating layer ILD1, a second interlayer insulating layer ILD2, a first via insulating layer VIA1, a second via insulating layer VIA2, a second substrate SUB2, a third connection electrode CE3, a fourth connection electrode CE4, a second input pad IP2, a driving integrated circuit DIC and a data pad DP. The second input pad IP2 may be a pad among the input pads IP of FIG. 2 which is connected to the data pad DP.

The third connection electrode CE3 and the fourth connection electrode CE4 may be disposed on the first via insulating layer VIA1. A plurality of first connection electrodes may include the third connection electrode CE3 and the fourth connection electrode CE4. The third connection electrode CE3 and the fourth connection electrode CE4 are in a same layer as each other. The third connection electrode CE3 and the fourth connection electrode CE4 may include a conductive material. The third connection electrode CE3 may connect the second input pad IP2 and the driving integrated circuit DIC to each other. The fourth connection electrode CE4 may connect the data pad DP and the driving integrated circuit DIC to each other. Accordingly, the second input pad IP2 may transmit a data signal transmitted from an external device (e.g., the circuit film CF of FIG. 1) to the data pad DP, via the driving integrated circuit DIC.

The third connection electrode CE3 and the fourth connection electrode CE4 may be disposed in the gate driver. In this way, the driving integrated circuit DIC may be connected to the gate driver through the third connection electrode CE3 and the fourth connection electrode CE4.

Figure 9:
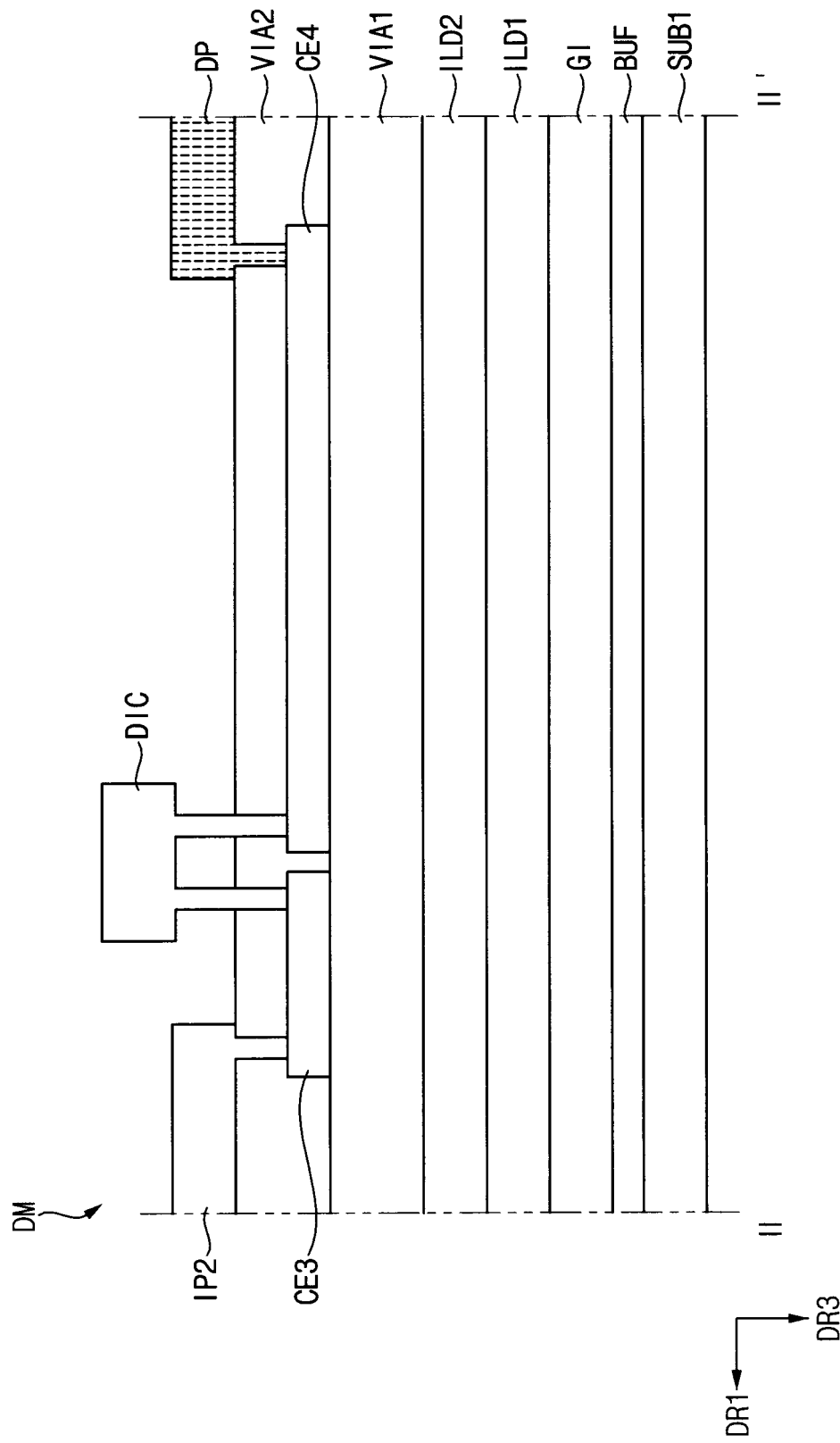
FIG. 9 is a cross-sectional view illustrating an embodiment taken along the line II-II' of FIG. 2.

FIG. 9 is a cross-sectional view illustrating an embodiment taken along the line II-II' of FIG. 2.

Referring to FIG. 9, FIG. 9 may be structurally the same as FIG. 8 except that the second substrate SUB2 is excluded from FIG. 8. However, the second via insulating layer VIA2 may include an inorganic insulating material to protect the lower layers from external impact. In an embodiment, for example, the second via insulating layer VIA2 may include at least one selected from silicon oxide ("SiOx"), silicon nitride ("SiNx"), silicon oxynitride ("SiNxOy") and the like.

Figure 10:
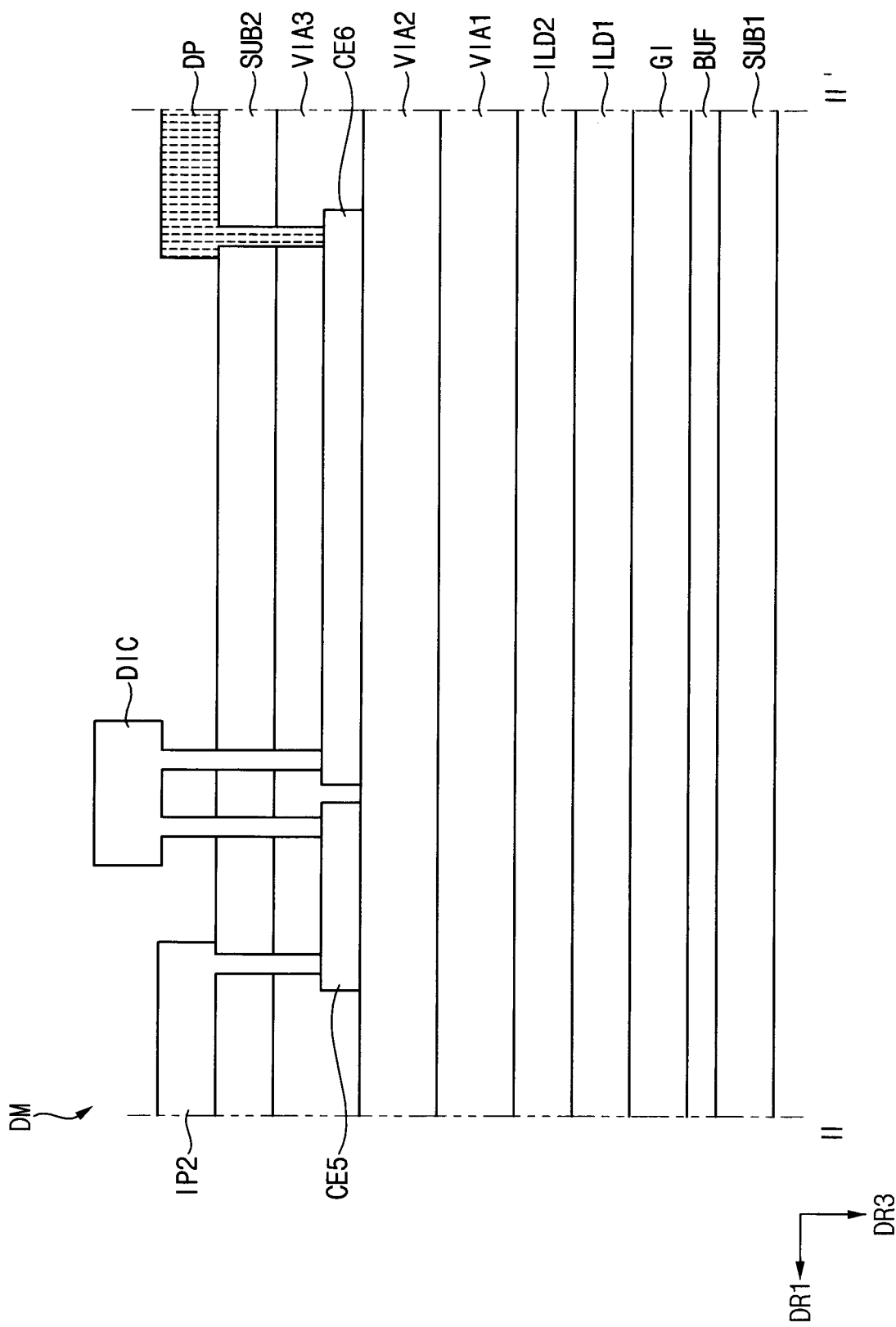
FIG. 10 is a cross-sectional view illustrating an embodiment taken along the line II-II' of FIG. 2.

FIG. 10 is a cross-sectional view illustrating an embodiment taken along the line II-II' of FIG. 2. FIG. 10 may be substantially the same as FIG. 8 except that the third via insulating layer VIA3, the fifth connection electrode CE5 and the sixth connection electrode CE6 are added.

Referring to FIG. 10, the fifth connection electrode CE5 and the sixth connection electrode CE6 may be disposed on the second via insulating layer VIA2. The fifth connection electrode CE5 and the sixth connection electrode CE6 are in a same layer as each other. The third via insulating layer VIA3 may be disposed to cover the fifth connection electrode CE5 and the sixth connection electrode CE6. The third connection electrode CE3 and the fourth connection electrode CE4 may include a conductive material.

The fifth connection electrode CE5 may connect the second input pad IP2 and the driving integrated circuit DIC to each other. The sixth connection electrode CE6 may connect the driving integrated circuit DIC and the data pad DP to each other. Through this, the second input pad IP2 may be electrically connected to the data pad DP. However, this is exemplary, and the second input pad IP2 and the data pad DP may be electrically connected through more electrodes. In an embodiment, for example, the second input pad IP2 and the data pad DP may be electrically connected through connection electrodes disposed on the first via insulating layer VIA'.

Figure 11:
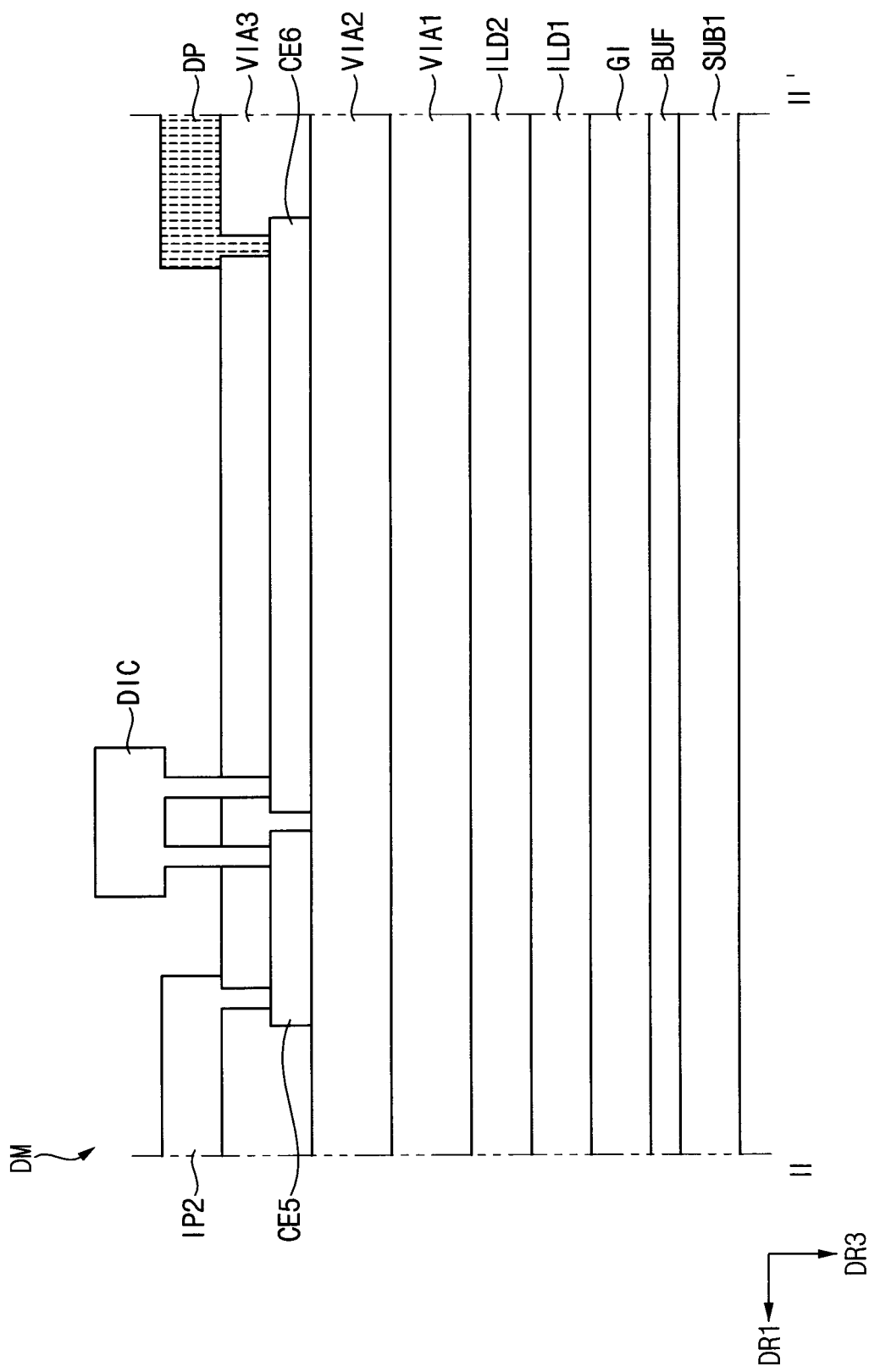
FIG. 11 is a cross-sectional view illustrating an embodiment taken along the line II-II' of FIG. 2.

FIG. 11 is a cross-sectional view illustrating an embodiment taken along the line II-II' of FIG. 2.

Referring to FIG. 11, FIG. 11 may be structurally the same as FIG. 10 except that the second substrate SUB2 is excluded from FIG. 10. However, in order to protect the lower layers from external impact, the third via insulating layer VIA3 may include an inorganic insulating material. In an embodiment, for example, the third via insulating layer VIA3 may include at least one selected from silicon oxide ("SiOx"), silicon nitride ("SiNx") and silicon oxynitride ("SiNxOy").

Figure 12:
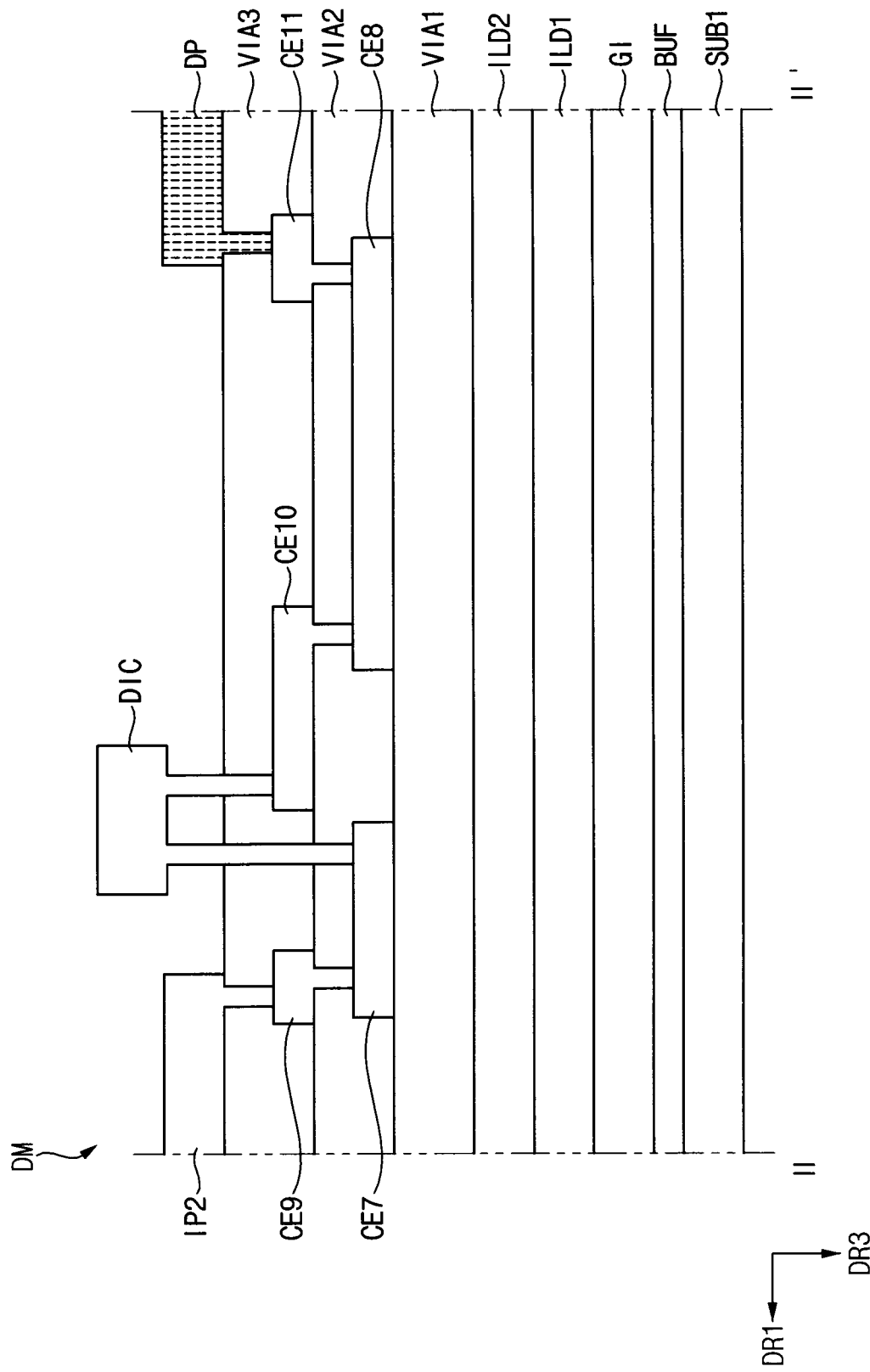
FIG. 12 is a cross-sectional view illustrating an embodiment taken along the line II-II' of FIG. 2.
Figure 13:
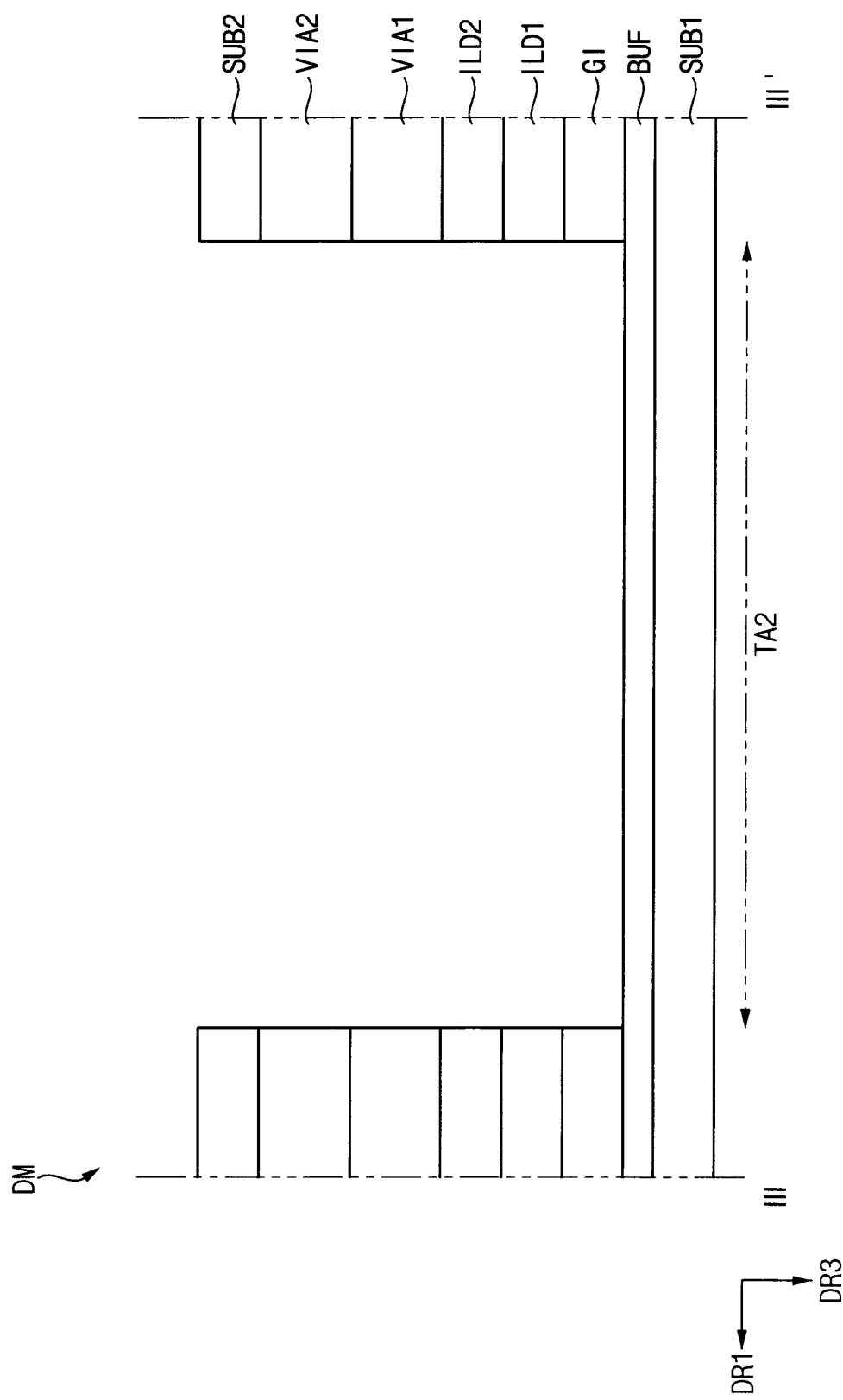
FIGS. 13 to 16 are cross-sectional views illustrating embodiments of the transmissive area of FIG. 1.
Figure 14:
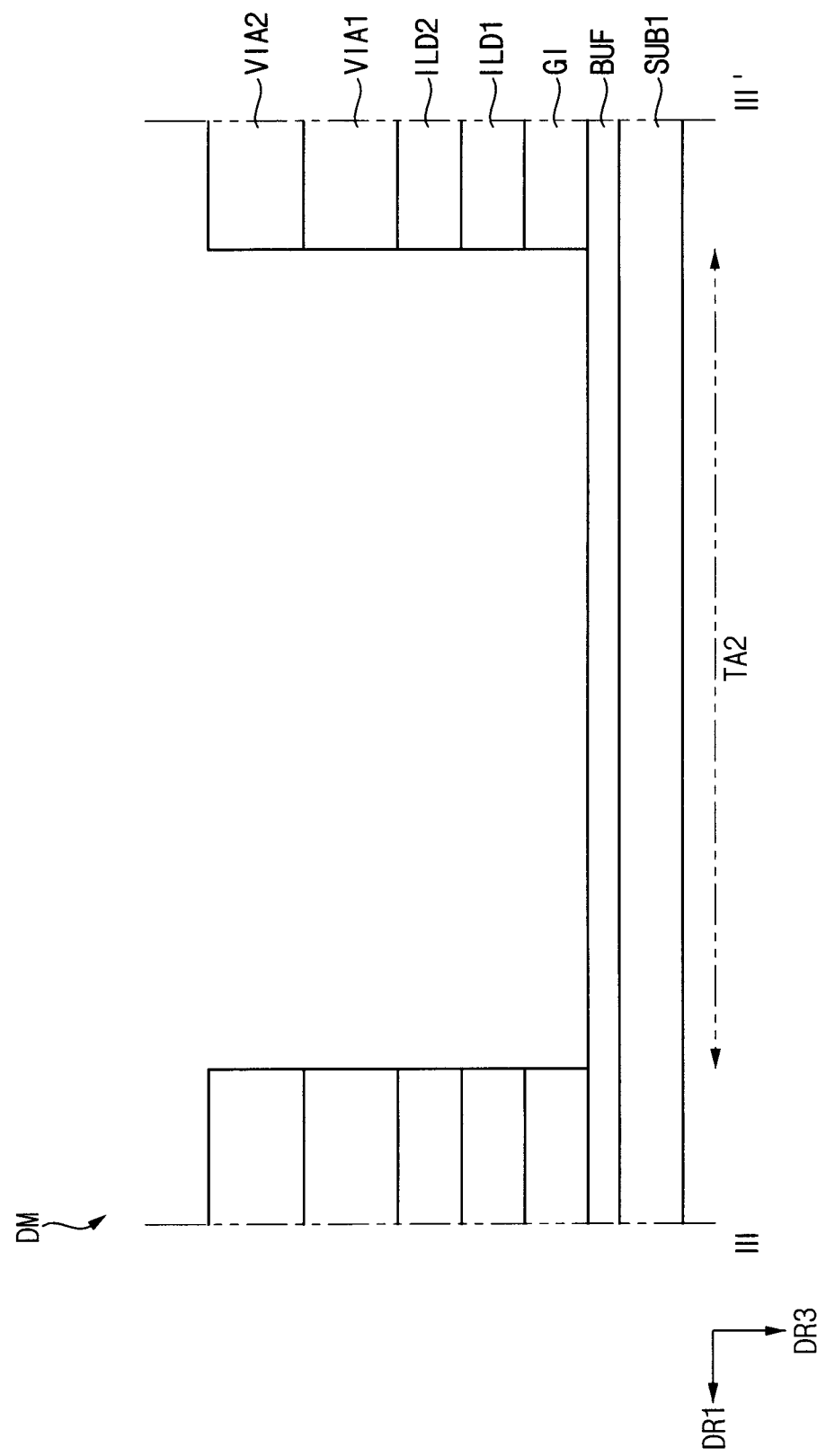
Figure 15:
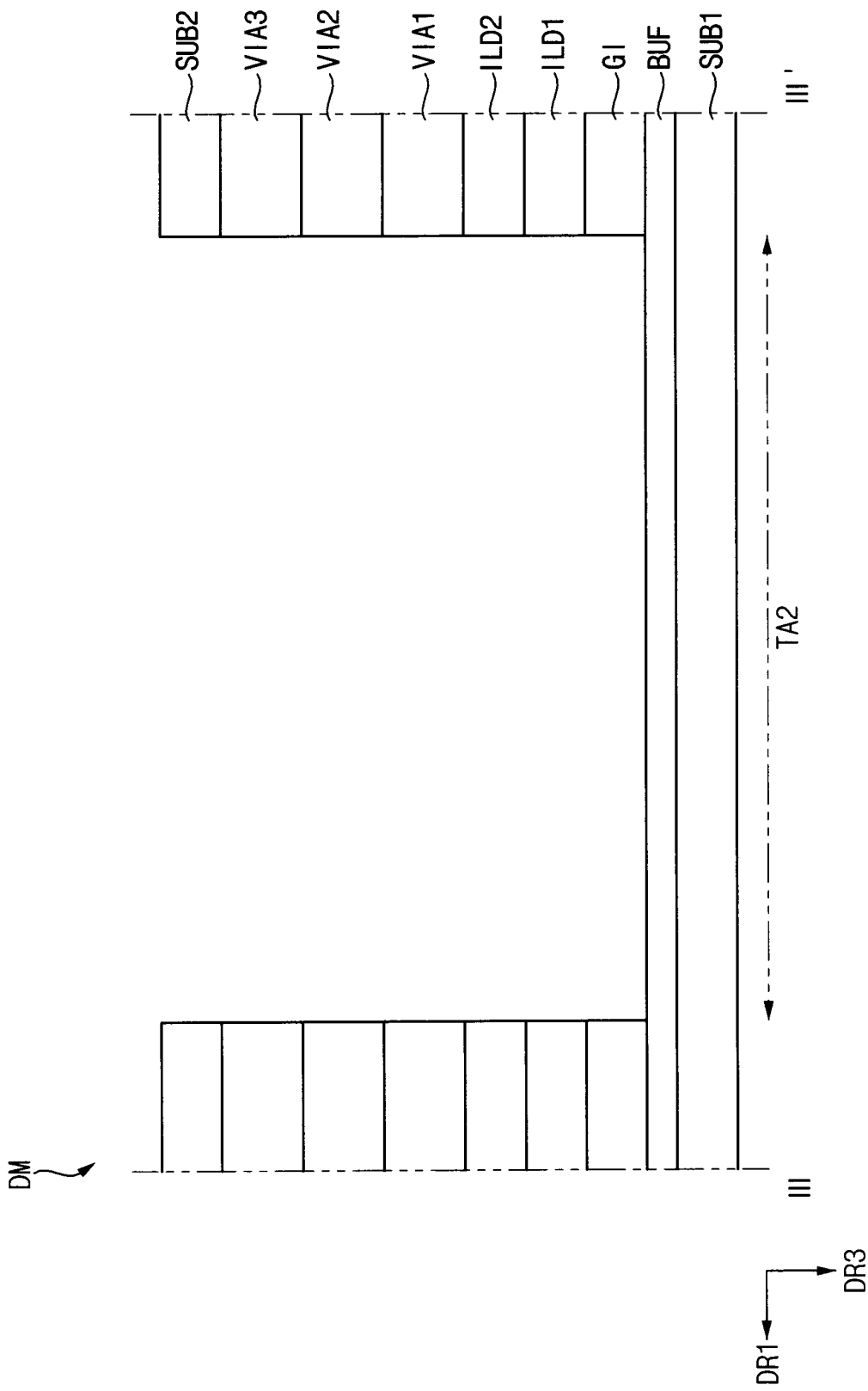
Figure 16:
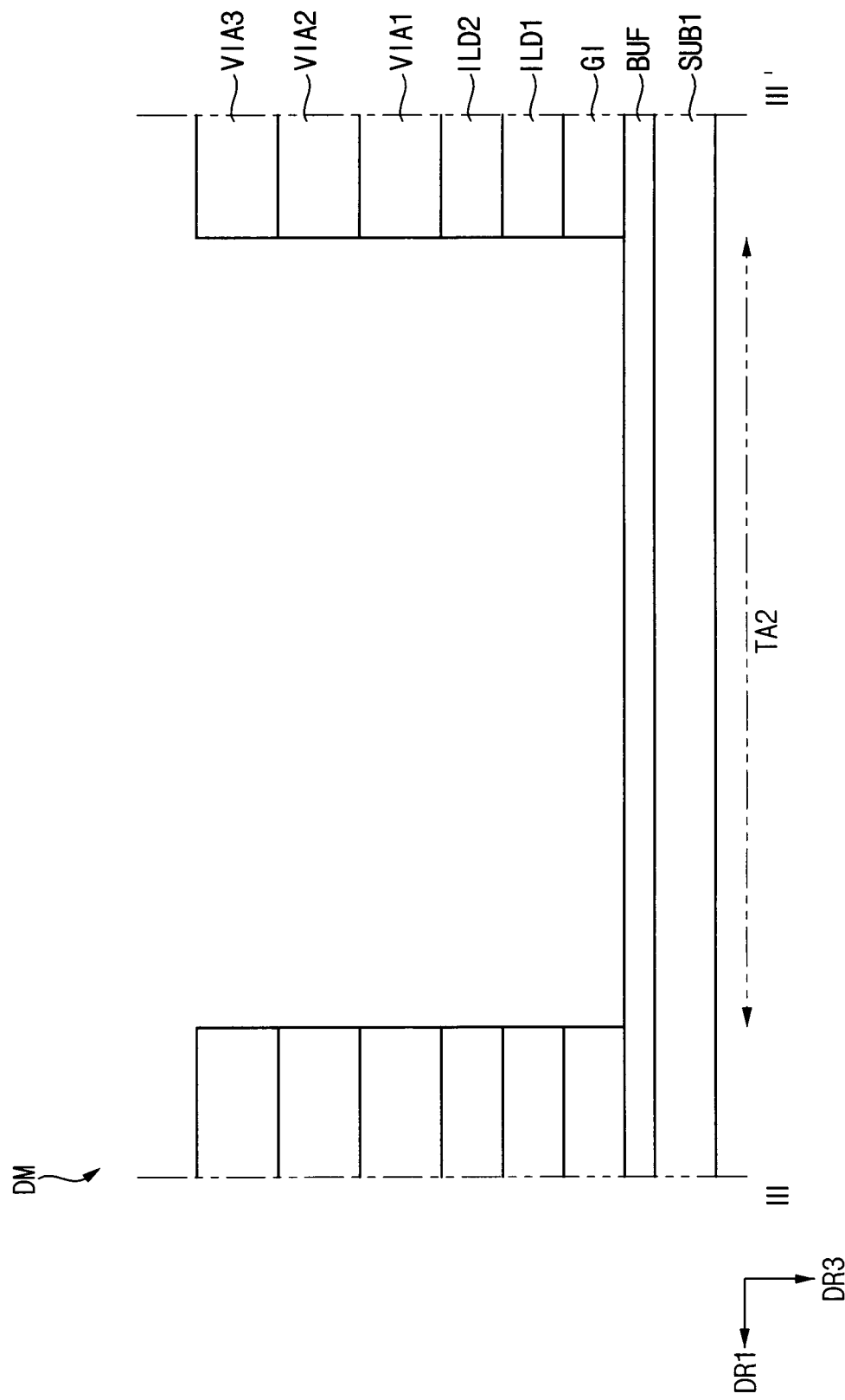

FIG. 12 is a cross-sectional view illustrating an embodiment taken along the line II-II' of FIG. 2.

Referring to FIG. 12, a seventh connection electrode CE7 and an eighth connection electrode CE8 may be disposed on the first via insulating layer VIA1. A ninth connection electrode CE9, a tenth connection electrode CE10 and an eleventh connection electrode CE11 may be disposed on the second via insulating layer VIA2. The connection electrodes CE7, CE8, CE9, CE10 and CE11 may include a conductive material. A plurality of second connection electrodes may include more than one of the ninth connection electrode CE9, the tenth connection electrode CE10 and the eleventh connection electrode CE11.

The ninth connection electrode CE9 may be disposed between the second input pad IP2 and the seventh connection electrode CE7. The ninth connection electrode CE9 may connect the second input pad IP2 and the seventh connection electrode CE7 to each other. The seventh connection electrode CE7 may connect the ninth connection electrode CE9 and the driving integrated circuit DIC to each other. The tenth connection electrode CE10 may be disposed between the driving integrated circuit DIC and the eighth connection electrode CE8. The tenth connection electrode CE10 may connect the driving integrated circuit DIC and the eighth connection electrode CE8 to each other. The eleventh connection electrode CE11 may be disposed between the eighth connection electrode CE8 and the data pad DP. The eleventh connection electrode CE11 may connect the eighth connection electrode CE8 and the data pad DP to each other. Through this, a signal transmitted to the second input pad IP2 may be transmitted to the data pad DP through the driving integrated circuit DIC and various connection electrodes.

FIGS. 13 to 16 are cross-sectional views illustrating embodiments of the transmissive area of FIG. 1.

Referring to FIGS. 1, 2, 13, 14, 15, 16, the driving module DM may include at least one gate insulating layer, at least one interlayer insulating layer and at least one via insulating layer. The gate insulating layer, the interlayer insulating layer and the via insulating layer may be disposed in order from the first substrate SUB1. However, the gate insulating layer, the interlayer insulating layer and the via insulating layer may not be disposed in an area overlapping the second transmissive area TA2. That is, within the driving module DM, the gate insulating layer, the interlayer insulating layer and the via insulating layer are excluded from or disconnected at a transmissive area of the driving module DM. Through this, the driving module DM may secure the second transmissive area TA2 as a region through which light is more transmittable (e.g., light transmissive area) than at a remaining region of the driving module DM.

A thickness of the driving module DM and various components thereof is may be defined along the third direction DR3, e.g., a thickness direction. The driving module DM may have a thickness at the transmissive area which is less than a thickness at an area adjacent to the transmissive area. That is, the second transmissive area TA2 of the driving module DM is thinner than other portions of the driving module DM, so that the transmittance of light through the driving module DM at a respective transmissive area may be secured. FIGS. 13 to 16 illustrate the second transmissive area TA2 as a reference, however, the first transmissive area TA1 may have substantially the same structure.

In embodiments, the second transmissive area TA2 may be provided or formed in a planar area where the driving module DM overlaps the display panel DSP along the third direction DR3. That is, the second transmissive area TA2 may be provided formed at a first side of the driving module DM which is closest to the display panel DSP along the first direction DR1. In addition, the first transmissive area TA1 may be provided or formed in a planar area where the driving module DM overlaps the circuit film CF along the third direction DR3. That is, the first transmissive area TA1 may be provided or formed at a second side which is opposite to the first side of the driving module DM and closest to the circuit film CF along the first direction DR1.

In embodiments, an alignment mark may be provided in an area of the display panel DSP which overlaps the second transmissive area TA2 of the driving module DM. When the driving module DM is combined with the display panel DSP, the alignment mark of the display panel DSP may be recognized through the second transmissive area TA2 of the driving module DM from outside thereof. That is, overlapping of the driving module DM with the alignment mark disposes the alignment mark visible from outside of the driving module DM at the second transmissive area TA2 since light is transmittable through the driving module DM at the second transmissive area TA2 thereof.

In embodiments, an alignment mark may be provided in an area of the circuit film CF which overlaps the first transmissive area TA1. When the driving module DM is combined with the circuit film CF, the alignment mark of the circuit film CF may be recognized through the first transmissive area TA1. That is, overlapping of the driving module DM with the alignment mark disposes the alignment mark visible from outside of the driving module DM at the first transmissive area TA1 since light is transmittable through the driving module DM at the first transmissive area TA1 thereof.

Figure 17:
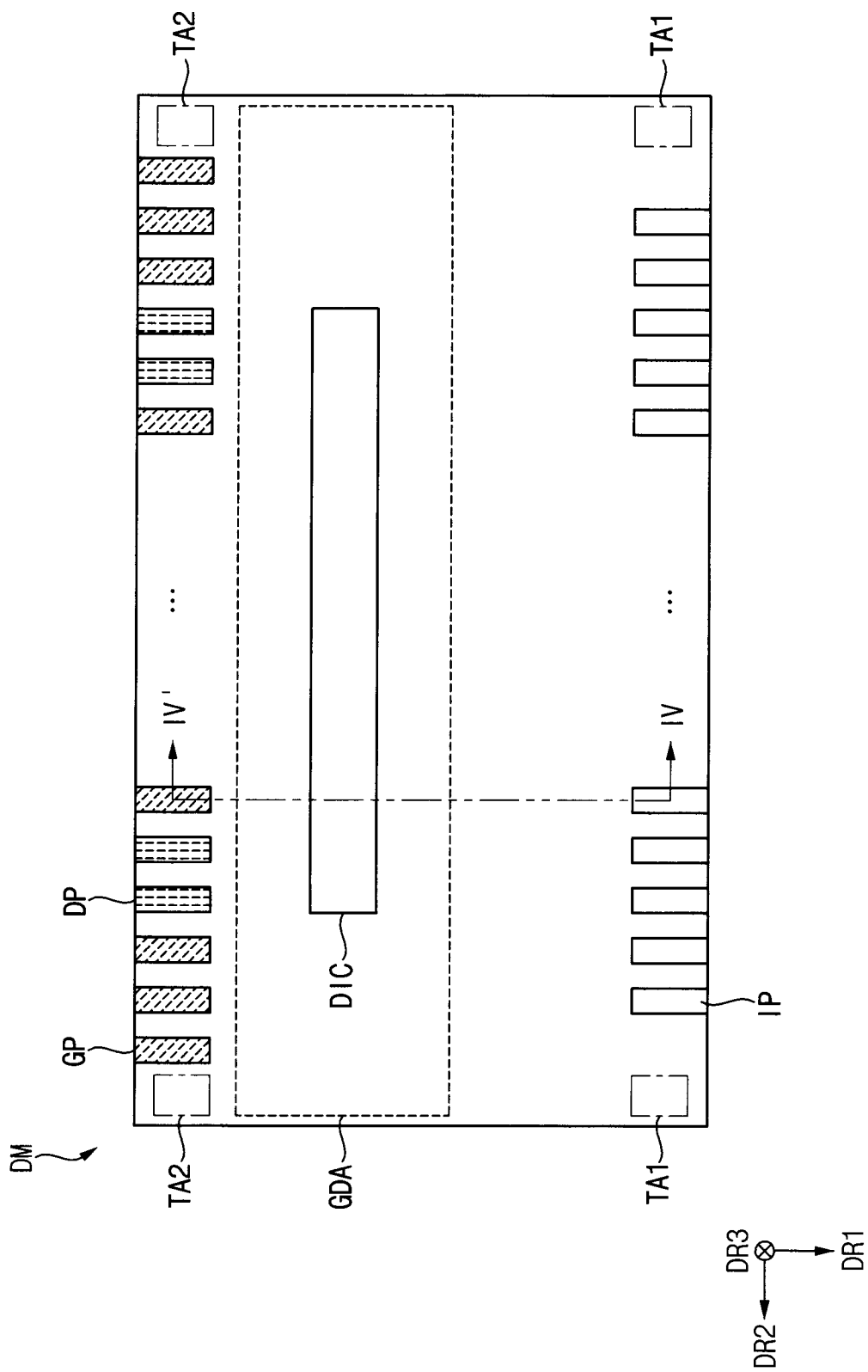
FIG. 17 is a plan view illustrating an embodiment of a display device.

FIG. 17 is a plan view illustrating an embodiment of a display device. FIG. 17 may be substantially the same as FIG. 2 except that the driving integrated circuit DIC overlaps or corresponds to the gate driving area GDA. That is, the driving integrated circuit DIC and the gate driver may overlap.

Figure 18:
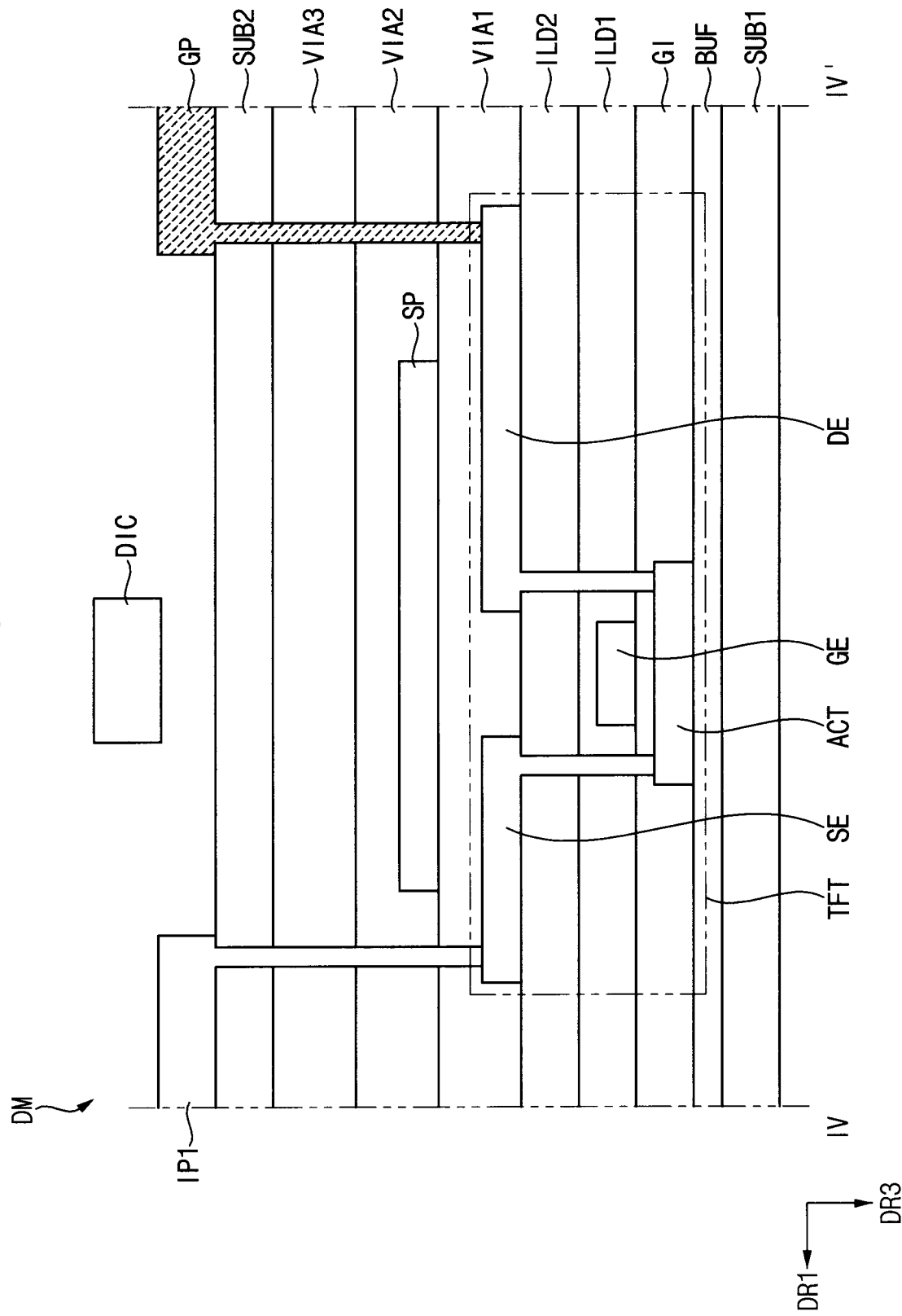
FIG. 18 is a cross-sectional view illustrating an embodiment taken along line IV-IV' of FIG. 17.

FIG. 18 is a cross-sectional view illustrating an embodiment taken along line IV-IV' of FIG. 17.

Referring to FIGS. 17 and 18, the gate driver may include at least one transistor and at least one capacitor. In an embodiment, for example, the gate driver may include a transistor TFT. The transistor TFT may overlap the driving integrated circuit DIC along the third direction DR3. In this case, when electrical signals are respectively applied to the transistor TFT and the driving integrated circuit DIC, they may electrically affect each other. Therefore, in order to reduce or effectively prevent an electrical effect between the transistor TFT and the driving integrated circuit DIC, a shielding electrode SP may be disposed on the first via insulating layer VIA1. A constant voltage may be applied to the shielding electrode SP. In FIG. 17, the shielding electrode SP is illustrated to be disposed on the first via insulating layer VIA1, but this is illustrative and is not limited thereto. In an embodiment, for example, the shielding electrode SP may be disposed on the second via insulating layer VIA2 or the third via insulating layer VIA3.

Figure 19:
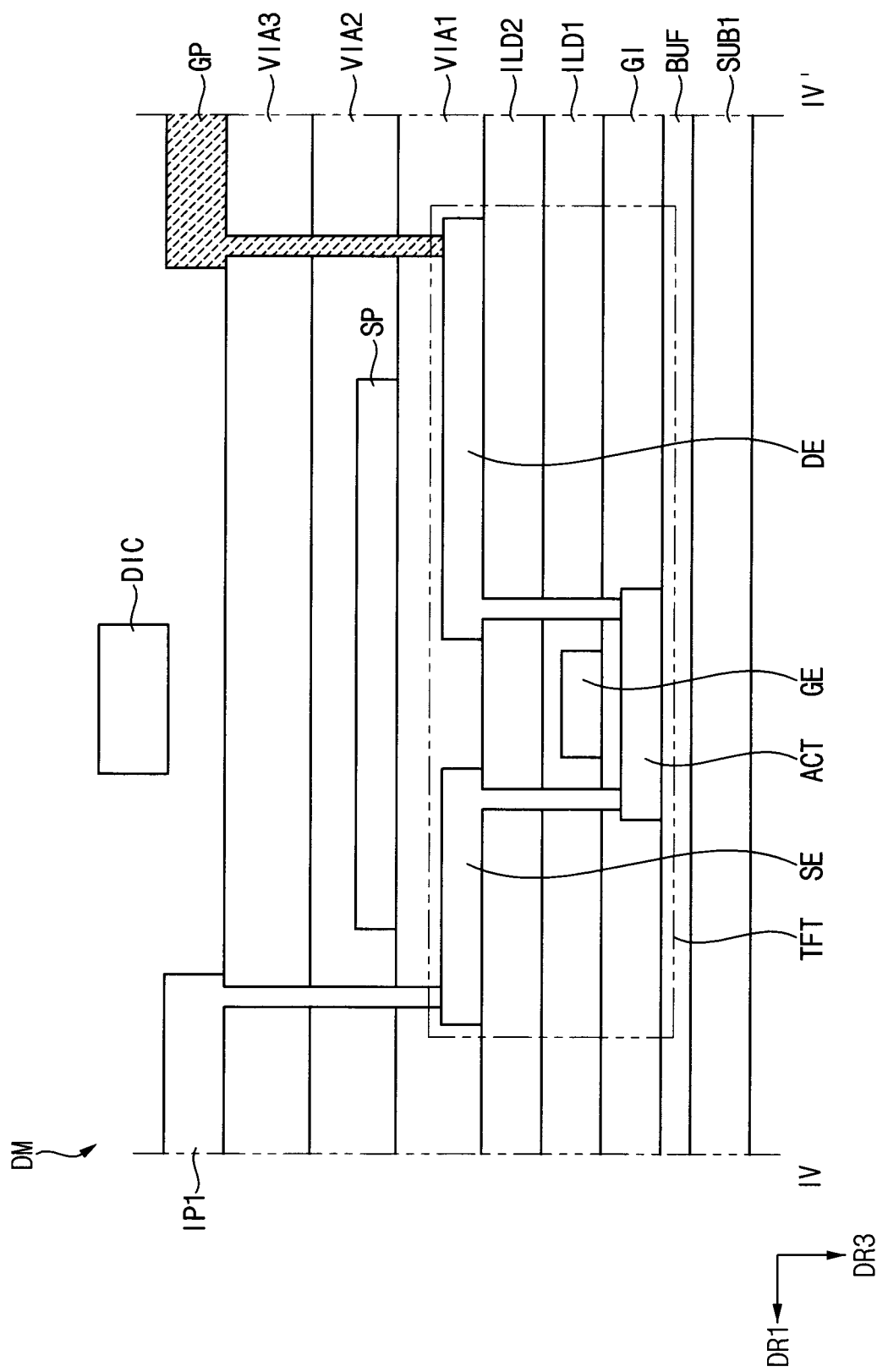
FIG. 19 is a cross-sectional view illustrating an embodiment taken along line IV-IV' of FIG. 17.

FIG. 19 is a cross-sectional view illustrating an embodiment taken along line IV-IV' of FIG. 17. FIG. 19 may be structurally the same as FIG. 18 except that the second substrate SUB2 is excluded from FIG. 18. However, in order to protect the lower layers from external impact, the third via insulating layer VIA3 may include an inorganic insulating material. In an embodiment, for example, the third via insulating layer VIA3 may include at least one selected from silicon oxide ("SiOx"), silicon nitride ("SiNx"), and silicon oxynitride ("SiNxOy").

Figure 20:
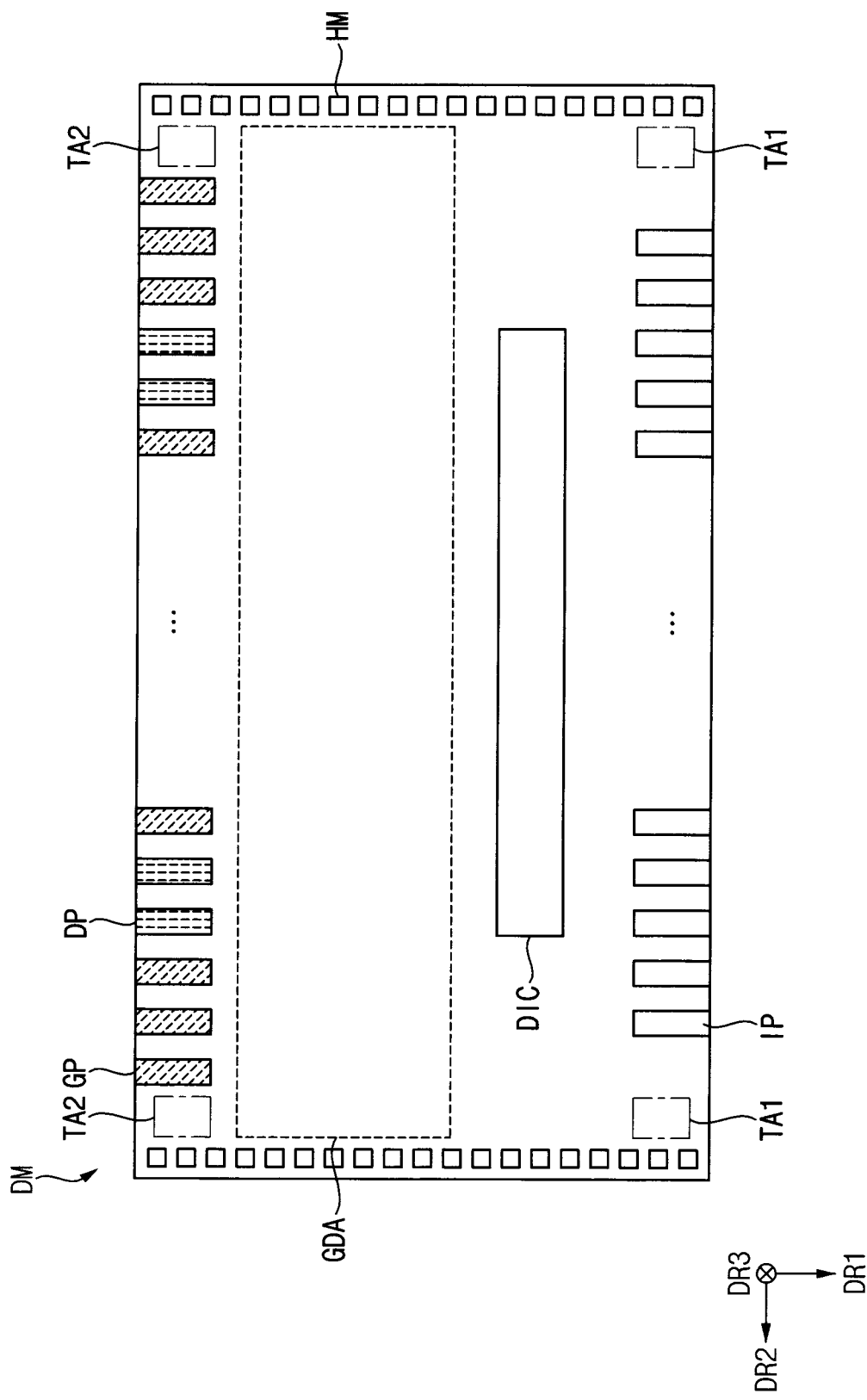
FIG. 20 is a plan view illustrating an embodiment of a driving module included in the display device of FIG. 1.

FIG. 20 is a plan view illustrating an embodiment of a driving module DM included in the display device of FIG. 1.

Referring to FIG. 20, the driving module DM may include a first side along which the data pads DP and the gate pads GP are arranged, and a second side which is opposite to the first side and closest to the circuit film CF. A plurality of input pads IP may be arranged along the second side. The first side and the second side of the driving module DM are each extended along a second direction DR2. A third side and a fourth side are each extended along a first direction DR1 and connect the first side to the second side. The first side may be parallel to the second side, the third side may be parallel to the fourth side, and the first side may be perpendicular to the third side without being limited thereto.

A groove HM provided in plural including a plurality of grooves HM may be provided or formed along a third side and/or the fourth side.

In embodiments, providing a driving module DM may include providing a plurality of driving modules DM initially connected to each other. Thereafter, the plurality of driving modules DM may be divided to provide individual ones of the driving module DM. In this case, the plurality of driving modules DM which are initially connected to each other may be provided in a roll or roll type arrangement. In an embodiment of providing a driving module DM, for example, the plurality of driving modules DM may be connected to each other, stored together with each other and moved together with each other in a roll form which is wound around a cylinder. In this case, the grooves HM may be provided or formed in the driving modules DM to easily wind the roll form of the plurality of driving modules DM around the cylinder. In an embodiment, for example, protrusions which correspond to the grooves HM may be provided or formed in the cylinder to engage with the grooves HM.

Figure 21:
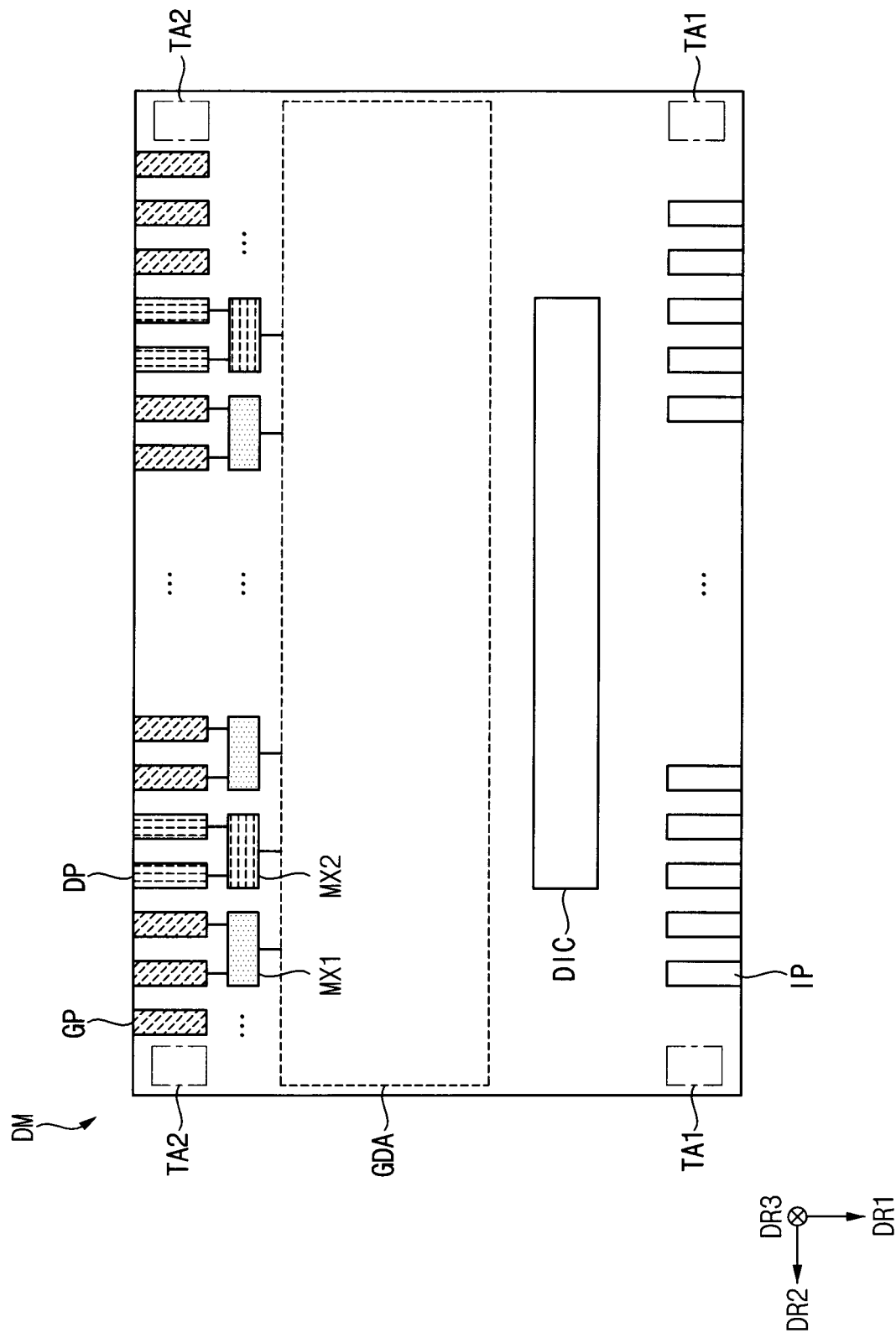
FIG. 21 is a plan view illustrating an embodiment of a driving module included in the display device of FIG. 1.

FIG. 21 is a plan view illustrating an embodiment of a driving module DM included in the display device of FIG. 1.

Referring to FIGS. 2 and 21, the driving module DM may include a first multiplexer MX1 provided in plural including a plurality of first multiplexers MX1 and a second multiplexer MX2 provided in plural including a plurality of second multiplexers MX2. The first multiplexers MX1 may be connected to the gate pads GP. In embodiments, each of the first multiplexers MX1 may be connected to the gate driver by a single line (e.g., single signal line or conductive line). Each one of the first multiplexers MX1 may be connected to two of the gate pads GP by two lines, respectively. However, this is exemplary, and each of the first multiplexers MX1 may be respectively connected to three or more gate pads GP by three or more lines.

The second multiplexers MX2 may be connected to the data pads DP. In embodiments, each of the second multiplexers MX2 may be connected to the driving to integrated circuit DIC by a single line. One of the second multiplexers MX2 may be respectively connected to two data pads DP by two lines. However, this is exemplary, and one of the second multiplexers MX2 may be respectively connected to three or more data pads DP by three or more lines.

In this way, the driving module DM may include multiplexers in order to reduce the number of lines disposed in the driving module DM.

The foregoing is illustrative of the invention and is not to be construed as limiting thereof. Although embodiments of the invention have been described, those skilled in the art will readily appreciate that many modifications are possible in the embodiments without materially departing from the novel teachings and advantages of the invention. Accordingly, all such modifications are intended to be included within the scope of the invention as defined in the claims.

In the claims, means-plus-function clauses are intended to cover the structures described herein as performing the recited function and not only structural equivalents but also equivalent structures. Therefore, it is to be understood that the foregoing is illustrative of the invention and is not to be construed as limited to the embodiments disclosed, and that modifications to the disclosed embodiments, as well as other embodiments, are intended to be included within the scope of the appended claims. The invention is defined by the following claims, with equivalents of the claims to be included therein.

What is claimed is:

1. An displayelectronic device comprising:
   a display panel comprising a display area and a non-display area which extends from the display area in a first direction and defines an outside end of the display panel;
   a driving integrated circuit body electrically connected to the display panel;
   a driving integrated substrate which electrically connects the driving integrated circuit body to the display panel, the driving integrated substrate including:
      a first input pad through which a first driving signal is input to the driving integrated substrate from outside thereof, the first input pad non-overlapping the non-display area of the display panel along a thickness direction of the driving integrated substrate;
      a first substrate which overlaps the first input pad along the thickness direction of the driving integrated substrate, the first substrate continuously extending in the first direction from the first input pad, toward the display area, to define an outside end of the first substrate which overlaps the non-display area of the display panel along the thickness direction of the driving integrated substrate; and
      between the first input pad and the outside end of the first substrate:
         the driving integrated circuit body including opposing edges along the first direction which are each non-overlapping the non-display area of the display panel along the thickness direction of the driving integrated substrate, a gate electrode of a transistor including the gate electrode, a source electrode and a drain electrode among which the source electrode or the drain electrode overlaps the driving integrated circuit body along the thickness direction of the driving integrated substrate, and a gate pad which is connected to the transistor at the drain electrode and through which the first driving signal is output from the driving integrated substrate to the display panel.

2. The electronic device of claim 1, wherein the driving integrated substrate further includes:

a second input pad through which a second driving signal is input to the driving integrated substrate from outside thereof, the second input pad non-overlapping the non-display area of the display panel; and between the second input pad and the outside end of the first substrate:

a data pad through which the second driving signal is output from the driving integrated substrate to the display panel;

a first connection electrode and a second connection electrode spaced apart from each other along the driving integrated substrate; and the first and the second connection electrodes being between the transistor and the driving integrated circuit body, along the thickness direction of the driving integrated substrate.

3. The electronic device of claim 2, wherein the first connection electrode connects the source electrode of the transistor and the first input pad to each other, and the second connection electrode connects the drain electrode of the transistor and the gate pad to each other.

4. The electronic device of claim 2, wherein between the first input pad and the outside end of the first substrate, the driving integrated substrate further includes:

a first multiplexer connected to the data pad; and a second multiplexer connected to the gate pad.

5. The electronic device of claim 2, wherein the first connection electrode connects the second input pad and the driving integrated circuit body to each other, and the second connection electrode connects the driving integrated circuit body and the data pad to each other.

6. The electronic device of claim 5, wherein between the second input pad and the outside end of the first substrate, the driving integrated substrate further includes:

a third connection electrode which connects the first connection electrode and the second input pad to each other; and a fourth connection electrode which connects the data pad and the second connection electrode to each other, and the first to fourth connection electrodes between the transistor and the driving integrated circuit body, along the thickness direction of the driving integrated substrate.

7. The electronic device of claim 1, wherein the driving integrated substrate further includes:

a second input pad through which a second driving signal is input to the driving integrated substrate from outside thereof, the second input pad non-overlapping the non-display area of the display panel; and between the second input pad and the outside end of the first substrate:

a data pad through which the second driving signal is output from the driving integrated substrate to the display panel; and a first connection electrode and a second connection electrode in a same layer as the source electrode of the transistor.

8. The electronic device of claim 7, wherein the first connection electrode connects the second input pad and the driving integrated circuit body to each other, and the second connection electrode connects the driving integrated circuit body and the data pad to each other.

9. The electronic device of claim 1, wherein the driving integrated substrate further includes a second substrate facing the first substrate, the second substrate being between the source electrode and the first input pad and between the drain electrode and the gate pad.

10. The electronic device of claim 9, wherein each of the first substrate and the second substrate includes polyimide.

11. The electronic device of claim 1, wherein between the first input pad and the outside end of the first substrate, the driving integrated substrate further includes:

a gate driver including the transistor, and the driving integrated circuit body and the gate driver overlapping along the thickness direction of the driving integrated substrate.

12. The displayelectronic device of claim 11, wherein between the first input pad and the outside end of the first substrate, the driving integrated substrate further includes a shielding electrode between the driving integrated circuit body and the gate driver along the thickness direction of the driving integrated substrate.

13. The electronic device of claim 1, wherein the driving integrated substrate further includes:

a first side which is closest to the display panel and defines the outside end of the first substrate; and at the first side, a light transmissive area through which light is transmittable through the driving integrated substrate.

14. The electronic device of claim 13, wherein the driving integrated substrate further includes:

a gate insulating layer, a interlayer insulating layer, a via insulating layer and the first input pad in order, along the thickness direction of the driving integrated substrate, and the gate insulating layer, the interlayer insulating layer and the via insulating layer excluded from the light transmissive area.

15. The electronic device of claim 1, further comprising a circuit film from which the driving signals are provided to the driving integrated substrate, wherein the driving integrated substrate further includes:

a first side which is closest to the display panel and defines the outside end of the first substrate, and a second side which is opposite to the first side, and the circuit film is connected to the driving integrated substrate at the second side thereof.

16. The electronic device of claim 15, wherein the driving integrated substrate further includes at the second side, a light transmissive area through which light is transmittable through the driving integrated substrate.

17. The electronic device of claim 16, wherein the driving integrated substrate includes:

a gate insulating layer, a interlayer insulating layer, a via insulating layer and the first input pad in order, along the thickness direction of the driving integrated substrate, and the gate insulating layer, the interlayer insulating layer and the via insulating layer excluded from the light transmissive area.

18. The electronic device of claim 1, wherein the driving integrated substrate further includes the driving integrated circuit body provided in plural.

19. The electronic device of claim 1, wherein between the first input pad and the outside end of the first substrate, the driving integrated substrate further includes a gate driver which includes the transistor and is connected to the driving integrated circuit body.

20. The electronic device of claim 1, wherein the driving integrated substrate further includes:

a first side which is closest to the display panel and defines the outer end of the first substrate, a second side which is opposite to the first side, and a third side and a fourth side which each connect the first side to the second side, and a plurality of grooves defined along the third side and along the fourth side.

* * * * *